United States Patent
Kang et al.

(10) Patent No.: US 11,869,579 B2
(45) Date of Patent: Jan. 9, 2024

(54) PAGE BUFFER CIRCUIT AND MEMORY DEVICE INCLUDING THE SAME

(71) Applicant: Samsung Electronics Co., Ltd., Suwon-si (KR)

(72) Inventors: Inho Kang, Yongin-si (KR); Ilhan Park, Suwon-si (KR); Jinyoung Chun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 17/530,911

(22) Filed: Nov. 19, 2021

(65) Prior Publication Data

US 2022/0366964 A1    Nov. 17, 2022

(30) Foreign Application Priority Data

May 17, 2021   (KR) .......................... 10-2021-0063169

(51) Int. Cl.

| | | |
|---|---|---|
| G11C 11/4093 | (2006.01) | |
| G11C 11/406 | (2006.01) | |
| G11C 7/10 | (2006.01) | |
| G11C 11/4096 | (2006.01) | |
| G11C 11/4074 | (2006.01) | |
| G11C 11/4094 | (2006.01) | |

(52) U.S. Cl.
CPC ........ G11C 11/4093 (2013.01); G11C 7/1039 (2013.01); G11C 11/4074 (2013.01); G11C 11/4094 (2013.01); G11C 11/4096 (2013.01); G11C 11/40615 (2013.01)

(58) Field of Classification Search
CPC .............. G11C 11/4093; G11C 7/1039; G11C 11/40615; G11C 11/4074; G11C 11/4094; G11C 11/4096
USPC ..... 365/189.05, 230.08, 185.17, 185.23, 222
See application file for complete search history.

(56) References Cited

U.S. PATENT DOCUMENTS

| | | | |
|---|---|---|---|
| 6,324,113 B1 | 11/2001 | Tomita | |
| 7,336,543 B2 * | 2/2008 | Chen ................... | G11C 7/1042 365/185.11 |
| 7,388,790 B2 | 6/2008 | Maejima et al. | |
| 7,443,751 B2 | 10/2008 | Miller et al. | |
| 7,554,857 B2 | 6/2009 | Lee | |
| 7,558,149 B2 | 7/2009 | Chen et al. | |
| 7,679,133 B2 | 3/2010 | Son et al. | |
| 7,729,177 B2 | 6/2010 | Song et al. | |
| 8,553,466 B2 | 10/2013 | Han et al. | |
| 8,559,235 B2 | 10/2013 | Yoon et al. | |
| 8,570,801 B2 | 10/2013 | Lim et al. | |

(Continued)

FOREIGN PATENT DOCUMENTS

KR    2011/0131716 A    12/2011

*Primary Examiner* — Connie C Yoha
(74) *Attorney, Agent, or Firm* — Harness, Dickey & Pierce, P.L.C.

(57) ABSTRACT

A page buffer circuit includes a plurality of page buffers connected to a plurality of bitlines. Each of the plurality of page buffers includes a bitline selection transistor configured to connect a corresponding bitline of the plurality of bitlines to a sensing node, a precharge circuit configured to precharge the sensing node, and a dynamic latch circuit configured to store data in a storage node. Each of the plurality of page buffers is configured to refresh the data stored in the storage node through charge sharing between the storage node and the sensing node.

20 Claims, 19 Drawing Sheets

(56) References Cited

U.S. PATENT DOCUMENTS

| | | |
|---|---|---|
| 8,654,587 B2 | 2/2014 | Yoon et al. |
| 8,929,155 B2 | 1/2015 | Yoo et al. |
| 2006/0187710 A1* | 8/2006 | Son ................... G11C 16/102 |
| | | 365/185.09 |
| 2011/0233648 A1 | 9/2011 | Seol et al. |
| 2018/0292989 A1* | 10/2018 | Lee ..................... G11C 16/32 |

* cited by examiner

FIG. 12

| REFRESH METHOD | NO SHARING | SENSING NODE SHARING (8SO SHARING) |
|---|---|---|
| CHARGE SHARING | 2.8 fF <-> 20 fF | 2.8 fF <-> 160 fF |
| TRET | 5.1 ms | 7.8 ms |

PAGE BUFFER CIRCUIT AND MEMORY DEVICE INCLUDING THE SAME

CROSS-REFERENCE TO RELATED APPLICATION

This application claims priority under 35 USC § 119 to Korean Patent Application No. 10-2021-0063169, filed on May 17, 2021 in the Korean Intellectual Property Office (KIPO), the contents of which are herein incorporated by reference in their entirety.

BACKGROUND

1. Technical Field

Example embodiments relate generally to semiconductor integrated circuits, and more particularly to page buffer circuits, and memory devices including the page buffer circuits.

2. Description of the Related Art

Semiconductor memory devices can be roughly divided into two categories depending upon whether or not they retain stored data when disconnected from a power supply. These two categories are: volatile memory devices, which lose stored data when disconnected from power, and nonvolatile memory devices, which retain stored data when disconnected from power. A nonvolatile memory device includes a page buffer circuit that has a sensing node for determining a state of a memory cell therein (e.g., data stored in the memory cell). For example, the state of the memory cell may be determined by detecting a current flowing through the sensing node. Recently, to reduce a size and power consumption of a page buffer circuit, a page buffer circuit including a dynamic latch circuit that has a size smaller than that of a normal latch circuit (or a static latch circuit) has been developed.

SUMMARY

At least one example embodiment of the present disclosure provides a page buffer circuit capable of efficiently refreshing data stored in a dynamic latch circuit.

At least one example embodiment of the present disclosure provides a nonvolatile memory device that includes the page buffer circuit.

According to example embodiments, a page buffer circuit includes a plurality of page buffers connected to a plurality of bitlines. Each of the plurality of page buffers includes a bitline selection transistor configured to connect a corresponding bitline of the plurality of bitlines to a sensing node, a precharge circuit configured to precharge the sensing node, and a dynamic latch circuit configured to store data in a storage node. Each of the plurality of page buffers is configured to refresh the data stored in the storage node through charge sharing between the storage node and the sensing node.

According to example embodiments, a page buffer circuit includes a plurality of page buffers connected to a plurality of bitlines. Each of the plurality of page buffers includes a bitline selection transistor configured to connect a corresponding bitline of the plurality of bitlines to a sensing node, a precharge circuit configured to precharge the sensing node in response to a load signal, a dynamic latch circuit configured to store data in a storage node, a first sensing node sharing transistor configured to connect the sensing node of each of the plurality of page buffers and the sensing node of a previous page buffer of the plurality of page buffers in response to a sensing node sharing signal, and a second sensing node sharing transistor configured to connect the sensing node of each of the plurality of page buffers and the sensing node of a next page buffer of the plurality of page buffers in response to the sensing node sharing signal. N page buffers of the plurality of page buffers are configured to connect the sensing nodes of the N page buffers to each other in response to the sensing node sharing signal, where N is an integer greater than 1. The N page buffers are configured to perform a first precharge operation that precharges the sensing nodes of the N page buffers in response to the load signal. One page buffer of the N page buffers is configured to perform a first read operation that stores inverted data that are inverted from the data of the storage node of the one page buffer to the sensing nodes of the N page buffers in response to a read signal. The one page buffer is configured to perform a first write operation that stores the inverted data of the sensing nodes of the N page buffers to the storage node of the one page buffer in response to a write signal. The N page buffers are configured to perform a second precharge operation that precharges the sensing nodes of the N page buffers in response to the load signal. The one page buffer is configured to perform a second read operation that stores the data that are inverted from the inverted data of the storage node of the one page buffer to the sensing nodes of the N page buffers in response to the read signal. The one page buffer is configured to perform a second write operation that stores the data of the sensing nodes of the N page buffers to the storage node of the one page buffer in response to the write signal.

According to example embodiments, a memory device includes a memory cell array and a page buffer circuit. The memory cell array includes a plurality of memory cells connected to a plurality of bitlines and a plurality of wordlines. The page buffer circuit includes a plurality of page buffers connected to the plurality of bitlines. Each of the plurality of page buffers includes a bitline selection transistor configured to connect a corresponding bitline of the plurality of bitlines to a sensing node, a precharge circuit configured to precharge the sensing node, and a dynamic latch circuit configured to store data in a storage node. Each of the plurality of page buffers is configured to refresh the data stored in the storage node through charge sharing between the storage node and the sensing node.

In the page buffer circuit and the memory device according to example embodiments, each page buffer may refresh data stored in a storage node of a dynamic latch circuit through charge sharing between the storage node and a sensing node of the page buffer (or N sensing nodes of N page buffers, where N is an integer greater than 1). Accordingly, the page buffer circuit according to example embodiments can efficiently refresh the data stored in the storage node of the dynamic latch circuit without an additional latch circuit for a refresh operation.

BRIEF DESCRIPTION OF THE DRAWINGS

Illustrative, non-limiting example embodiments will be more clearly understood from the following detailed description taken in conjunction with the accompanying drawings.

FIG. 12 is a diagram illustrating an example of retention times of page buffer circuits of FIGS. 1 and 7.

DETAILED DESCRIPTION

Figure 1:
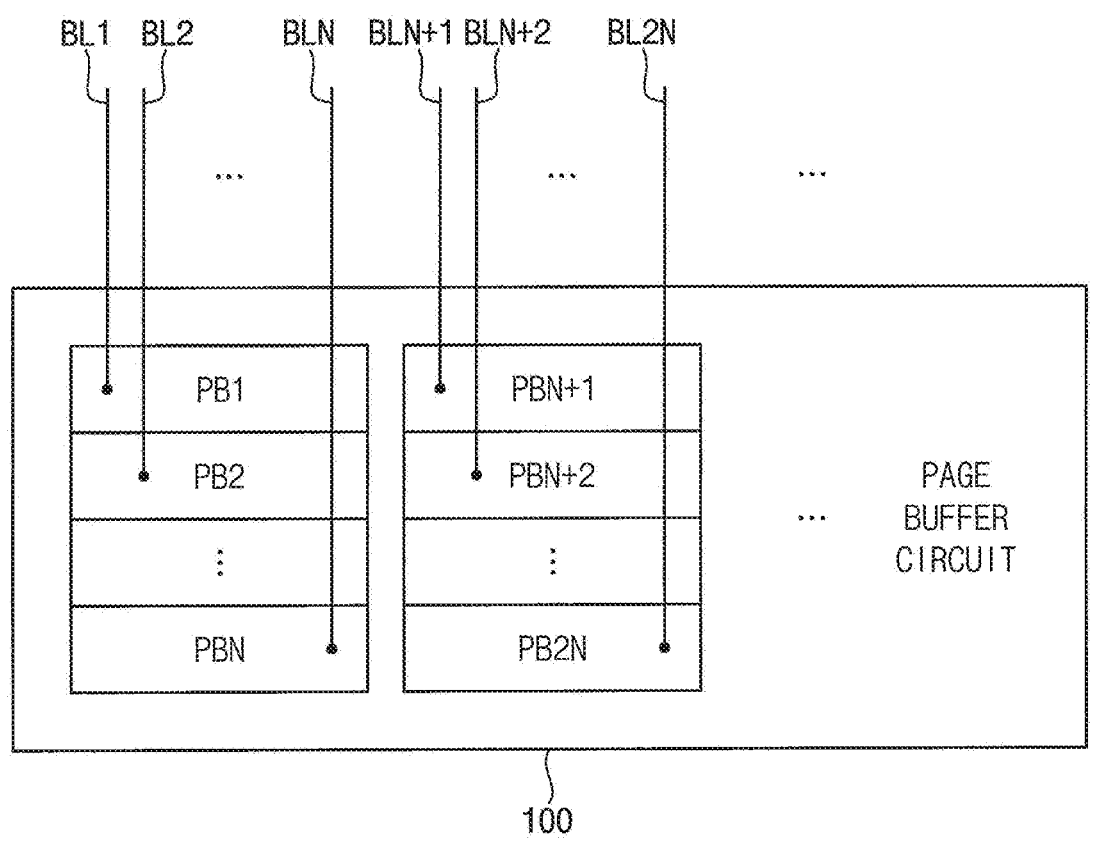
FIG. 1 is a block diagram illustrating a page buffer circuit according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a page buffer circuit according to example embodiments.

Referring to FIG. 1, a page buffer circuit 100 includes a plurality of page buffers PB1, PB2, . . . , PBN, PBN+1, PBN+2, . . . , PB2N.

The plurality of page buffers PB1 through PB2N may be respectively connected to a plurality of bitlines BL1, BL2, . . . , BLN, BLN+1, BLN+2, . . . , BL2N of a memory cell array. For example, a first page buffer PB1 may be connected to a first bitline BL1, and an N-th page buffer PBN may be connected to an N-th bitline BLN, where N is an integer greater than 1. In some example embodiments, the page buffer circuit 100 may have a structure where N stages of the page buffers PB1 through PBN or PBN+1 through PB2N are arranged. For example, N is 8, first through eighth page buffers PB1 through PBN are arranged along a first direction (e.g., an extending direction of each bitline BL1 through BL2N), ninth through sixteenth page buffers PBN+1 through PB2N are disposed in a second direction substantially perpendicular to the first direction from the first through eighth page buffers PB1 through PBN the ninth through sixteenth page buffers PBN+1 through PB2N are arranged along the first direction, and other page buffers may be further disposed in the second direction from the ninth through sixteenth page buffers PBN+1 through PB2N. In another example, N is 12, and the page buffer circuit 100 may have a structure where twelve stages of the page buffers PB1 through PBN or PBN+1 through PB2N are arranged.

Figure 2:
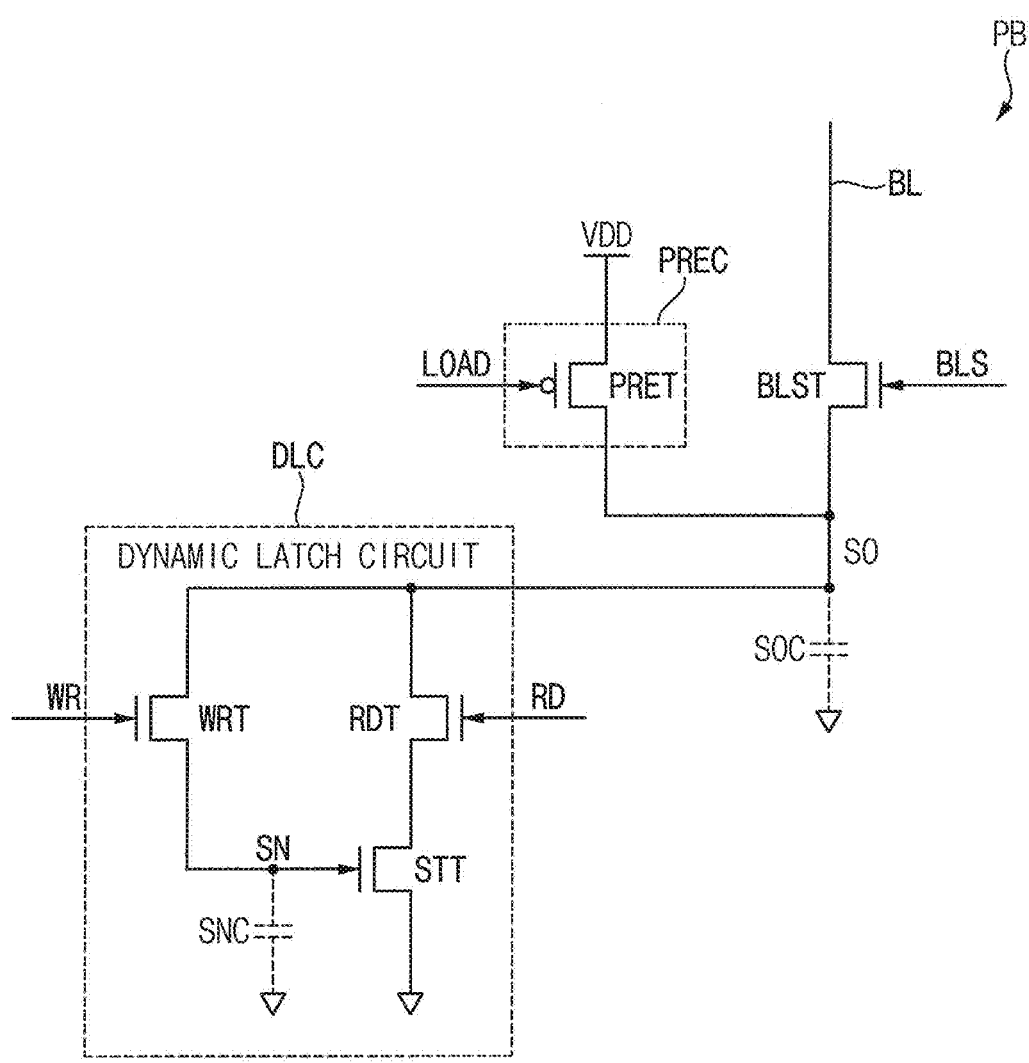
FIG. 2 is a circuit diagram illustrating each page buffer included in a page buffer circuit of FIG. 1 according to example embodiments.

FIG. 2 is a circuit diagram illustrating each page buffer included in a page buffer circuit of FIG. 1 according to example embodiments.

Referring to FIG. 2, each page buffer PB includes a bitline selection transistor BLST, a precharge circuit PREC and a dynamic latch circuit DLC.

The bitline selection transistor BLST may connect a bitline BL to a sensing node SO in response to a bitline selection signal BLS. In some example embodiments, the bitline selection transistor BLST may include a gate receiving the bitline selection signal BLS, a first terminal connected to the bitline BL, and a second terminal connected to the sensing node SO.

The precharge circuit PREC may precharge the sensing node SO to a power supply voltage VDD in response to a load signal LOAD. For example, the sensing node SO and a sensing capacitor SOC connected to the sensing node SO may be precharged to the power supply voltage VDD by the precharge circuit PREC. In some example embodiments, the sensing capacitor SOC may be, but not limited to, a parasitic capacitor formed between the sensing node SO and a ground voltage. In some example embodiments, the precharge circuit PREC may include a precharge transistor PRET including a gate receiving the load signal LOAD, a first terminal connected to the power supply voltage VDD, and a second terminal connected to the sensing node SO.

The dynamic latch circuit DLC may store data in a storage node SN. For example, the data may be stored by a storage capacitor SNC connected to the storage node SN. In some example embodiments, the storage capacitor SNC may be, but not limited to, a parasitic capacitor formed between the storage node SN and the ground voltage.

The dynamic latch circuit DLC may include a read transistor RDT that connects the sensing node SO to a storage transistor STT in response to a read signal RD, a write transistor WRT that connects the sensing node SO to the storage node SN in response to a write signal WR, and the storage transistor STT that connects the read transistor RDT to the ground voltage in response to a voltage of the storage node SN. In some example embodiments, the read transistor RDT may include a gate receiving the read signal RD, a first terminal connected to the sensing node SO, and a second terminal connected to the storage transistor STT, the write transistor WRT may include a gate receiving the write signal WR, a first terminal connected to the sensing node SO, and a second terminal connected to the storage node SN, and the storage transistor STT may include a gate connected to the storage node SN, a first terminal connected to the read transistor RDT, and a second terminal connected to the ground voltage.

The number of transistors RDT, WRT and STT of the dynamic latch circuit DLC may be less than the number of transistors of a static latch circuit including two inverters. Thus, the page buffer PB including the dynamic latch circuit DLC may have a size smaller than that of a page buffer including the static latch circuit. Further, the static latch circuit consumes power to retain stored data, but the dynamic latch circuit DLC may not consume power in retaining the stored data. Thus, power consumption of the page buffer PB including the dynamic latch circuit DLC may be less than that of the page buffer including the static latch circuit. However, the data stored by the dynamic latch circuit DLC may be distorted by a leakage current, and thus the page buffer PB may refresh the data stored in the storage node SN of the dynamic latch circuit DLC.

Although FIG. 2 illustrates an example where the precharge transistor PRET is implemented with a p-type metal oxide semiconductor (PMOS) transistor, and the bitline selection transistor BLST, the read transistor RDT, the write transistor WRT and the storage transistor STT are implemented with n-type metal oxide semiconductor (NMOS) transistors, respective transistors BLST, PRET, RDT, WRT and STT of the page buffer PB may be implemented with any transistors.

Hereinafter, examples of a refresh operation of each page buffer PB will be described below with reference to FIGS. 2 through 4.

Figure 3:
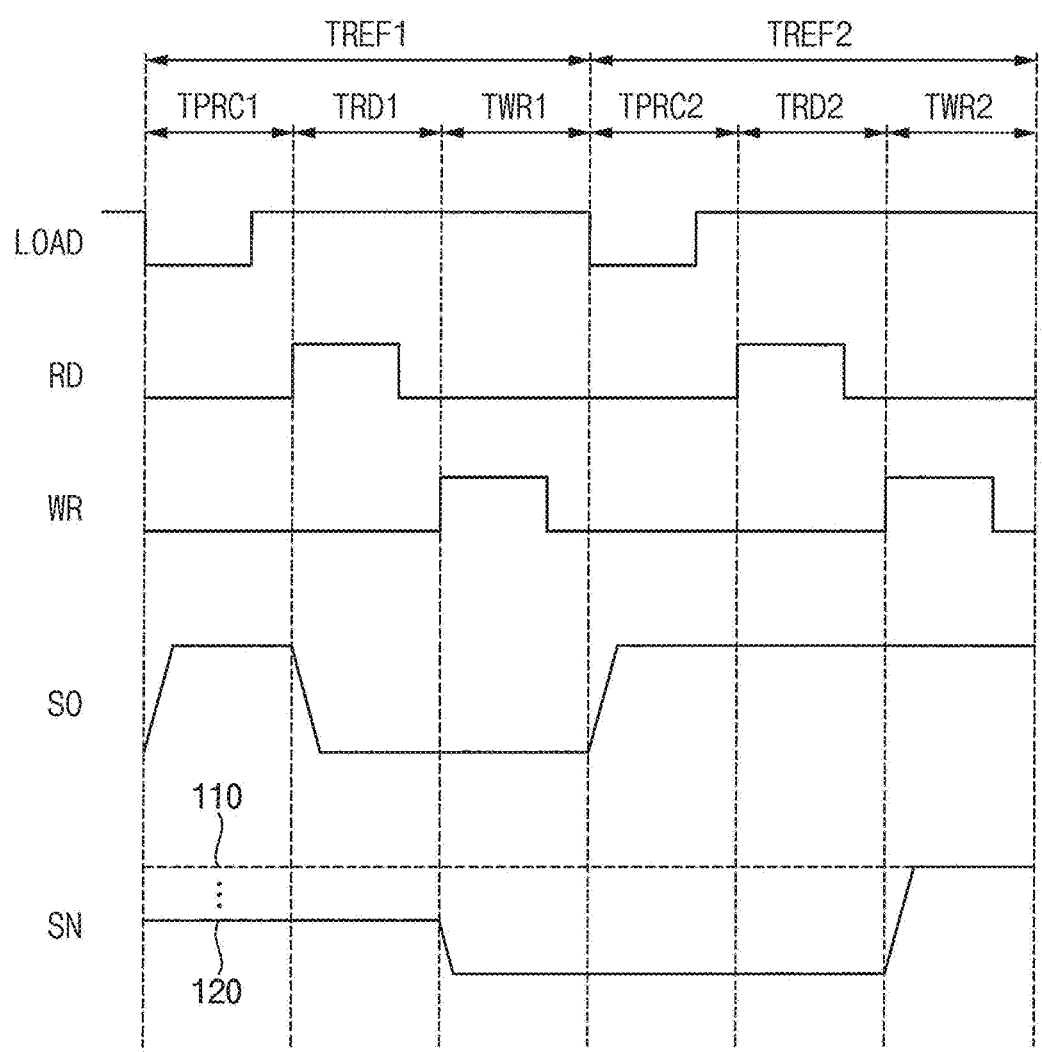
FIG. 3 is a timing diagram for describing an example of a refresh operation of a page buffer storing data representing a first state.

FIG. 3 is a timing diagram for describing an example of a refresh operation of a page buffer storing data representing a first state.

Referring to FIGS. 2 and 3, to refresh data stored in a storage node SN, a page buffer PB may perform a first refresh operation that stores inverted data that are inverted from the data in the storage node SN by using charge sharing between the storage node SN and a sensing node SO during a first refresh time TREF1, and may perform a second refresh operation that stores the data that are inverted from the inverted data in the storage node SN by using the charge sharing between the storage node SN and the sensing node SO during a second refresh time TREF2. The first refresh time TREF1 in which the first refresh operation is performed may include a first precharge time TPRC1, a first read time TRD1 and a first write time TWR1, and the second refresh time TREF2 in which the second refresh operation is performed may include a second precharge time TPRC2, a second read time TRD2 and a second write time TWR2.

In a case where the data stored in the storage node SN represent a first state corresponding to a value of '1' or a high level, to perform the first refresh operation that stores the inverted data representing a second state corresponding to a value of '0' or a low level in the storage node SN, in the first precharge time TPRC1, the precharge circuit PREC may perform a first precharge operation that precharges the sensing node SO to a power supply voltage VDD in response to a load signal LOAD.

In the first read time TRD1, a dynamic latch circuit DLC may perform a first read operation that stores the inverted data that are inverted from the data of the storage node SN to the sensing node SO in response to a read signal RD. For example, a read transistor RDT may be turned on in response to the read signal RD, a storage transistor STT may be turned on by a first voltage e.g., a high voltage) corresponding to the first state of the data of the storage node SN, and the turned-on read transistor RDT and the turned-on storage transistor STT may provide a ground voltage to the sensing node SO such that the inverted data representing the second state are stored in the sensing node SO. However, a voltage level 120 of the first voltage of the storage node SN may be decreased by a leakage current of the dynamic latch circuit DLC compared with a desired voltage level 110 or a voltage level 110 at a time point at which the data are stored in the storage node SN.

In the first write tune TWR1, the dynamic latch circuit DLC may perform a first write operation that stores the inverted data of the sensing node SO to the storage node SN in response to a write signal WR. For example, a write transistor WRT may be turned on in response to the write signal WR, and the turned-on write transistor WRT may connect the sensing node SO to the storage node SN. If the sensing node SO is connected to the storage node SN, the inverted data of the sensing node SO, or the inverted data representing the second state may be stored in the storage node SN by charge sharing between the storage node SN and the sensing node SO.

To perform the second refresh operation that stores the data representing the first state in the storage node SN, in the second precharge time TPRC2, the precharge circuit PREC may perform a second precharge operation that precharges the sensing node SO to the power supply voltage VDD in response to the load signal LOAD.

In the second read time TRD2, the dynamic latch circuit DLC may perform a second read operation that stores the data that are inverted from the inverted data of the storage node SN to the sensing node SO in response to the read signal RD. For example, the read transistor RDT may be turned on in response to the read signal RD, the storage transistor STT may be turned off by a second voltage (e.g., a low voltage) corresponding to the second state of the inverted data of the storage node SN, and the ground voltage may not be provided to the sensing node SO by the turned-off storage transistor STT. Thus, the sensing node SO may maintain the power supply voltage VDD stored by the second precharge operation, or the power supply voltage VDD corresponding to the data having the first state, and may store the data having the first state.

In the second write time TWR2, the dynamic latch circuit DLC may perform a second write operation that stores the data of the sensing node SO to the storage node SN in response to the write signal WR. For example, the write transistor WRT may be turned on in response to the write signal WR, and the turned-on write transistor WRT may connect the sensing node SO to the storage node SN. If the sensing node SO is connected to the storage node SN, the charge sharing may be performed between the storage node SN and the sensing node SO. In some example embodiments, a capacitance of a sensing capacitor SOC connected to the sensing node SO may be greater than a capacitance of a storage capacitor SNC connected to the storage node SN. Thus, by the charge sharing between the storage node SN and the sensing node SO, a voltage of the storage node SN may be changed to a voltage of the sensing node SO (or a voltage close to the voltage of the sensing node SO before the charge sharing). Thus, the data of the sensing node NO, or the data representing the first state may be stored in the storage node SN.

Once these first and second refresh operations are performed, the data stored in the storage node SN may be refreshed, and the voltage of the storage node SN may have the desired voltage level 110.

To refresh data stored in a dynamic latch circuit, a conventional page buffer may transfer the data stored in the dynamic latch circuit to another latch circuit, and may again transfer the data stored in the another latch circuit to the dynamic latch circuit. In the conventional page buffer, if there is no empty latch circuit or no latch circuit that does not store data, the data stored in the dynamic latch circuit cannot be refreshed. However, the page buffer PB of a page buffer circuit according to example embodiments may refresh the data stored in the storage node SN through the charge sharing between the storage node SN and the sensing node SO. Accordingly, the page buffer PB of the page buffer circuit according to example embodiments can efficiently refresh the data stored in the storage node SN of the dynamic latch circuit DLC without an additional latch circuit for a refresh operation.

Figure 4:
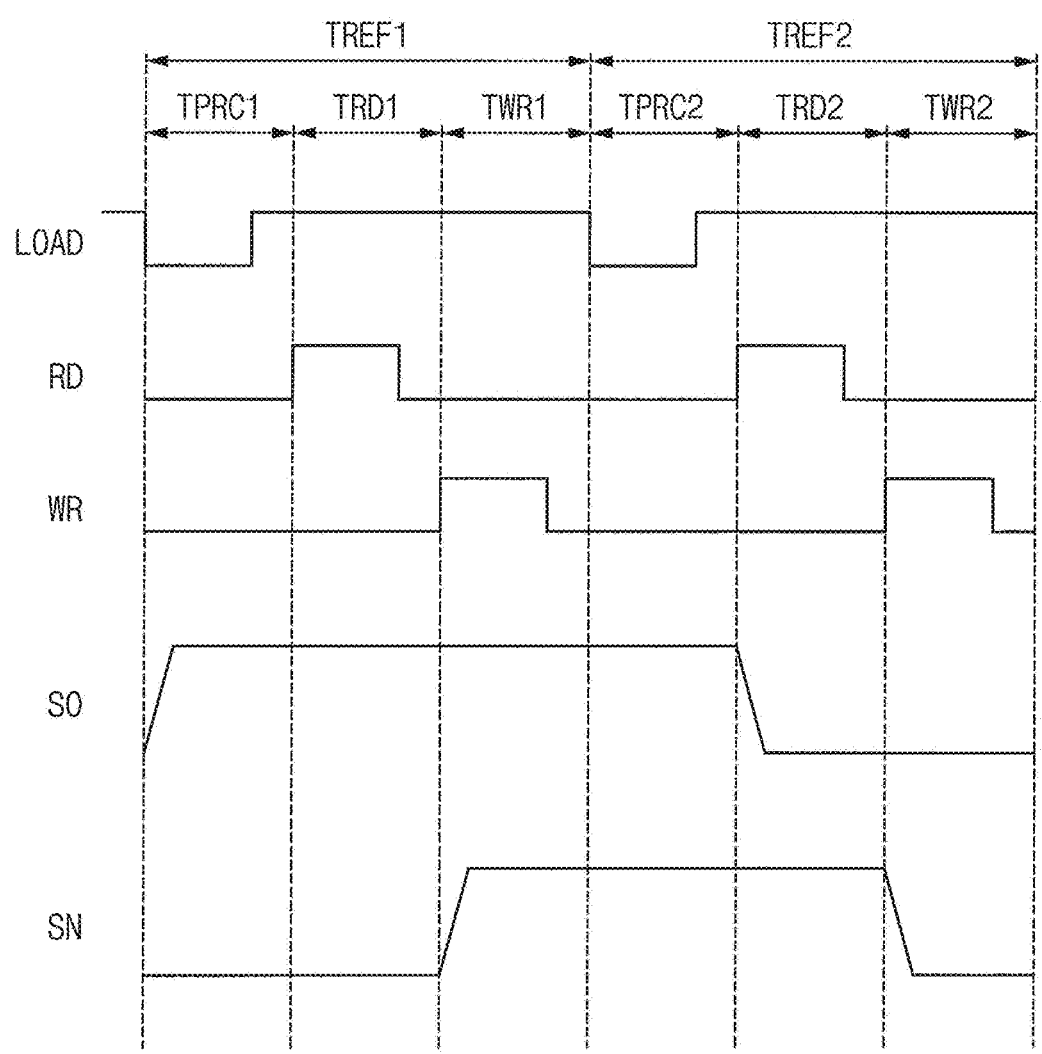
FIG. 4 is a timing diagram for describing an example of a refresh operation of a page buffer storing data representing a second state.

FIG. 4 is a timing diagram for describing an example of a refresh operation of a page buffer storing data representing a second state.

Referring to FIGS. 2 and 4, in a case where data stored in a storage node SN represent a second state corresponding to a value of '0' or a low level, to perform a first refresh operation that stores inverted data representing a first state corresponding to a value of '1' or a high level in the storage node SN, in a first precharge time TPRC1, a precharge circuit PREC may perform precharge a sensing node SO to a power supply voltage VDD in response to a load signal LOAD. In a first read time TRD1, a read transistor RDT may be turned on in response to a read signal RD, a storage transistor STT may be turned off by a second voltage corresponding to the second state of the data of the storage node SN, and a ground voltage may not be provided to the sensing node SO by the turned-off storage transistor STT such that the sensing node SO maintains the power supply voltage VDD corresponding to the inverted data having the first state. In a first write time TWR1, a write transistor WRT may be turned on in response to a write signal WR, and the turned-on write transistor WRT may connect the sensing node SO to the storage node SN such that the inverted data representing the first state are stored in the storage node SN by charge sharing between the storage node SN and the sensing node SO.

To perform a second refresh operation that stores the data representing the second state in the storage node SN, in a second precharge time TPRC2, the precharge circuit PREC may precharge the sensing node SO to the power supply voltage VDD in response to the load signal LOAD. In a second read time TRD2, the read transistor RDT may be turned on in response to the read signal RD, the storage transistor STT may be turned on by a first voltage corresponding to the first state of the inverted data of the storage node SN, and the turned-on read transistor RDT and the turned-on storage transistor STT may provide the ground voltage to the sensing node SO such that the data representing the second state are stored in the sensing node SO. In a second write time TWR2, the write transistor WRT may be turned on in response to the write signal WR, and the turned-on write transistor WRT may connect the sensing node SO to the storage node SN such that the data representing the second state are stored in the storage node SN by the charge sharing between the storage node SN and the sensing node SO. By these first and second refresh operations, the data stored in the storage node SN may be refreshed.

Figure 5:
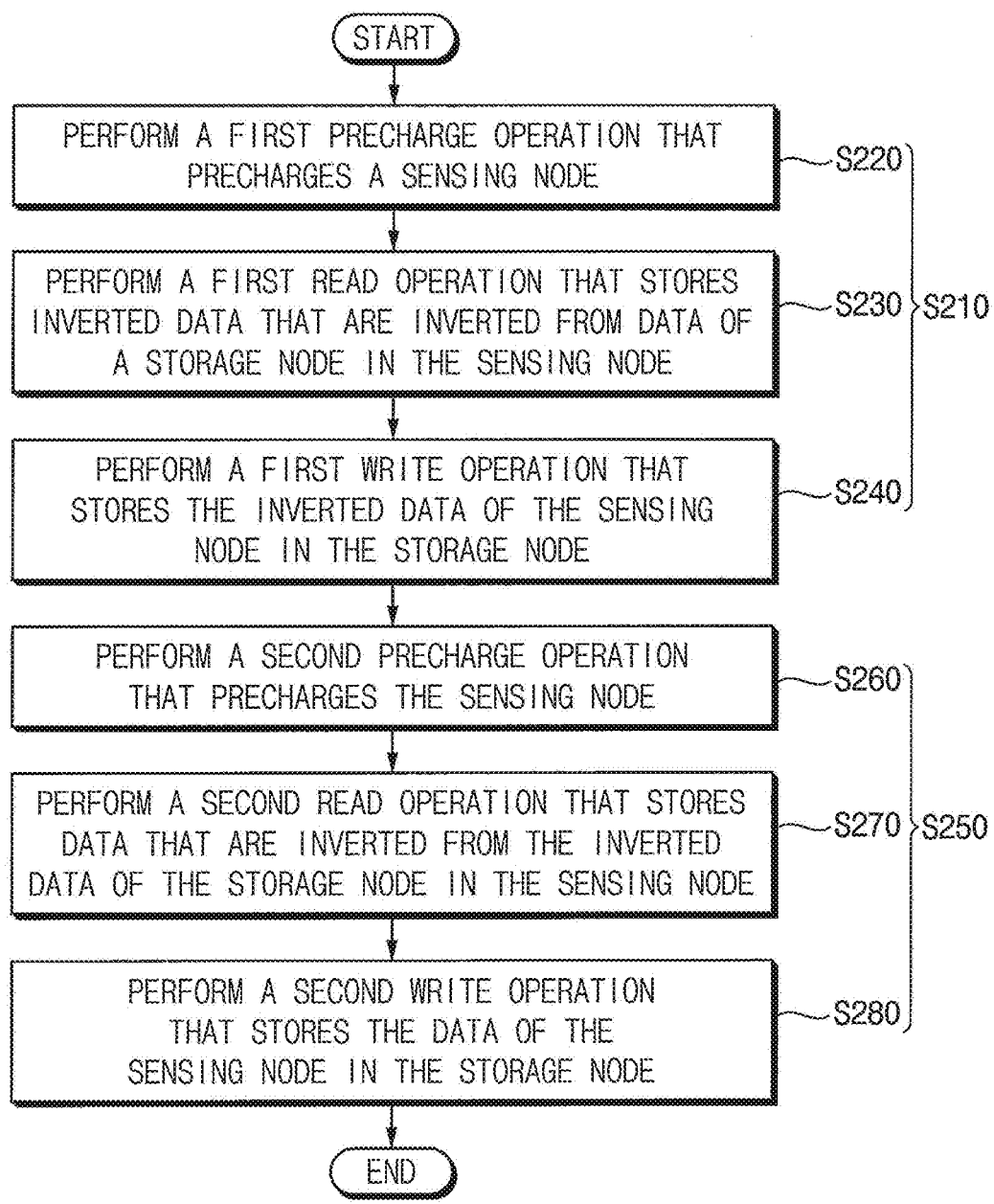
FIG. 5 is a flowchart illustrating a method of refreshing data in a page buffer circuit according to example embodiments.
Figure 6:
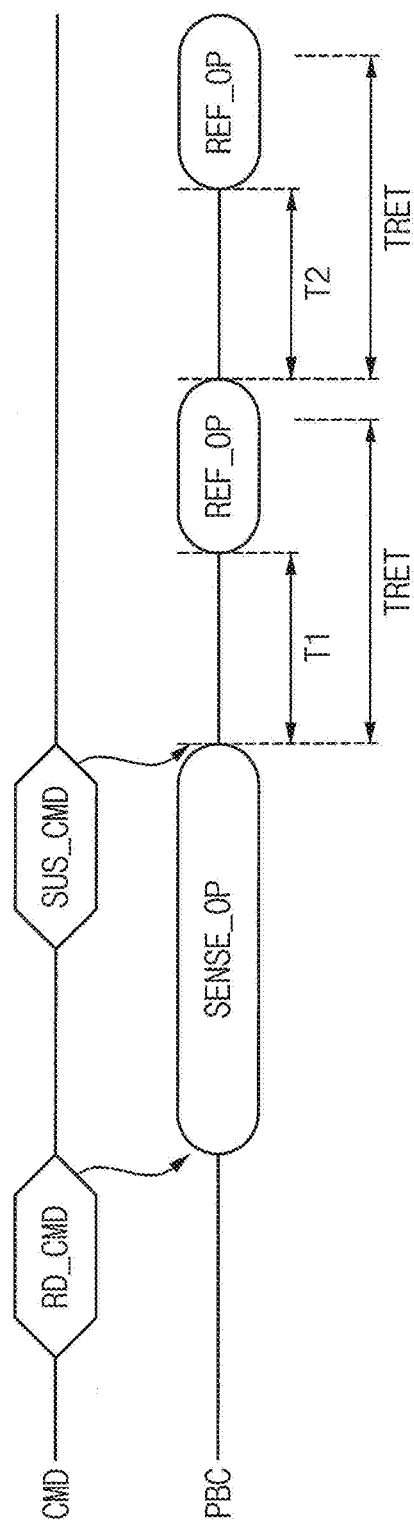
FIG. 6 is a tinning diagram for describing an example of a timing of a refresh operation of a page buffer circuit according to example embodiments.

FIG. 5 is a flowchart illustrating a method of refreshing data in a page buffer circuit according to example embodiments, and FIG. 6 is a timing diagram for describing an example of a timing of a refresh operation of a page buffer circuit according to example embodiments.

Referring to FIGS. 1, 2 and 5, each page buffer PB of a page buffer circuit 100 may refresh data stored in a storage node SN through charge sharing between the storage node SN and a sensing node SO. In some example embodiments, a plurality of page buffers PB1 through PB2N of the page buffer circuit 100 may substantially simultaneously refresh the data stored in the storage nodes SN of the plurality of page buffers PB1 through RB2N. Further, the page buffer circuit 100 may perform a data refresh operation within a retention time in which the data stored in the storage node SN are retained.

For example, as illustrated in FIG. 6, if a memory device including the page buffer circuit 100 or PBC receives a read command RD_CMD as a command CMD from an external memory controller, the page buffer circuit 100 or PBC may perform a sensing operation SENSE_OP that reads data stored in a memory cell array. If the memory device receives a suspend command SUS_CMD while the sensing operation SENSE_OP is performed, the page buffer circuit 100 or PBC may stop the sensing operation SENSE_OP. Before the retention time TRET is expired from a time point at which the sensing operation SENSE_OP is stopped, or after a first time T1 shorter than the retention time TRET from the time point at which the sensing operation SENSE_OP is stopped, the page buffer circuit 100 or PBC may perform a data refresh operation REF_OP. Further, before the retention time TRET is expired from a time point at which the data refresh operation REF_OP is completed, or after a second time T2 shorter than the retention time TRET from the time point at which the data refresh operation REF_OP is completed, the page buffer circuit 100 or PBC may perform a next data refresh operation REF_OP. In this manner, the page buffer circuit 100 or PBC may retain the read data until a command that resumes the sensing operation SENSE_OP is received.

To perform the data refresh operation REF_OP, or to refresh the data stored in the storage node SN, each page buffer PB of the page buffer circuit 100 may perform a first refresh operation (S210) and a second refresh operation (S250). To perform the first refresh operation (S210), the page buffer PB may perform a first precharge operation that precharges the sensing node SO (S220), may perform a first read operation that stores inverted data that are inverted from the data of the storage node SN to the sensing node SO (S230), and may perform a first write operation that stores the inverted data of the sensing node SO to the storage node SN (S240). Further, to perform the second refresh operation (S250), the page buffer PB may perform a second precharge operation that precharges the sensing node SO (S260), may perform a second read operation that stores the data that are inverted from the inverted data of the storage node SN to the sensing node SO (S270), and may perform a second write operation that stores the data of the sensing node SO to the storage node SN (S280). Accordingly, the page buffer PB can efficiently refresh the data stored in the storage node SN without an additional latch circuit for a refresh operation.

Figure 7:
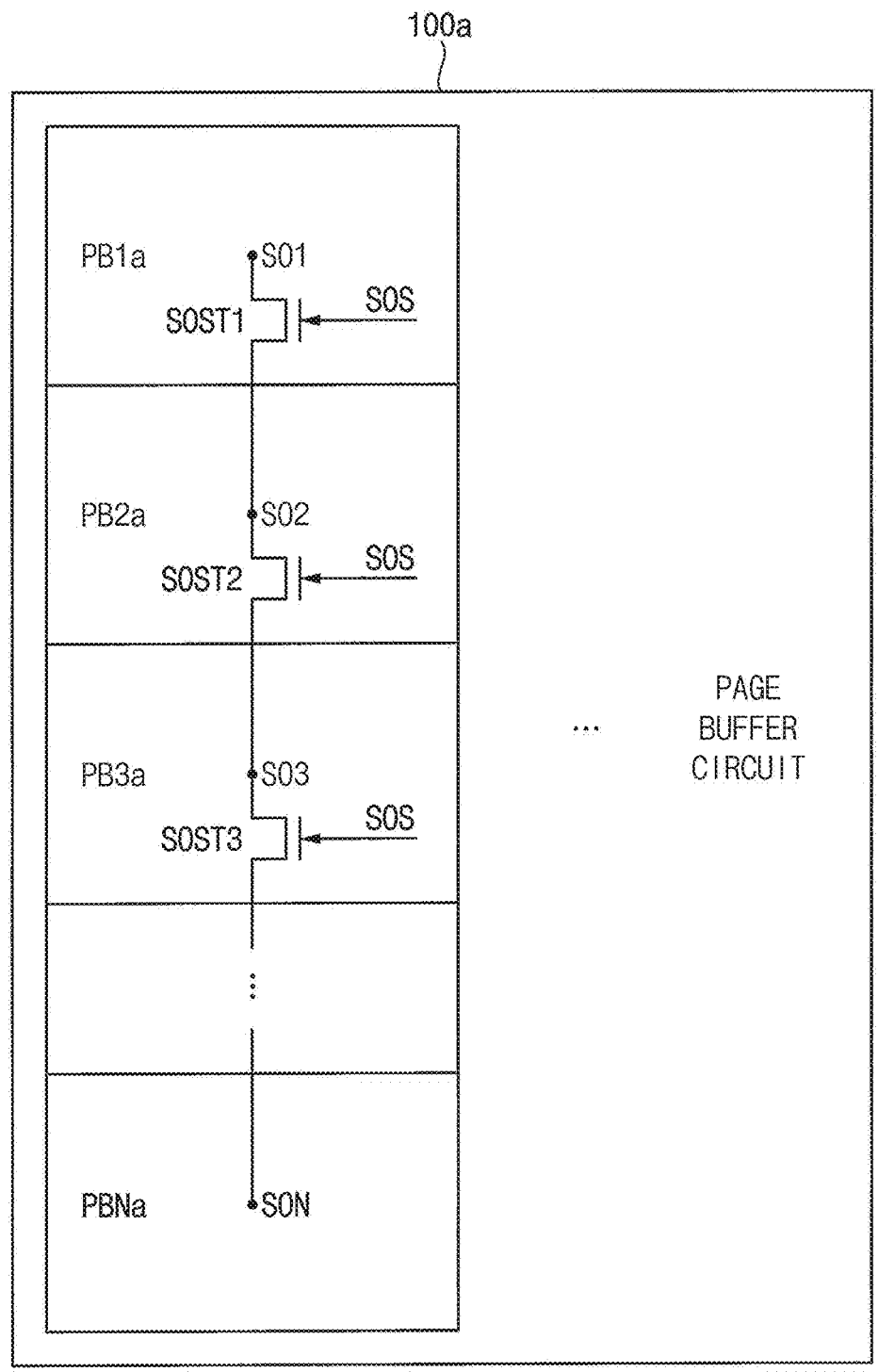
FIG. 7 is a block diagram illustrating page buffer circuit according to example embodiments.
Figure 8:
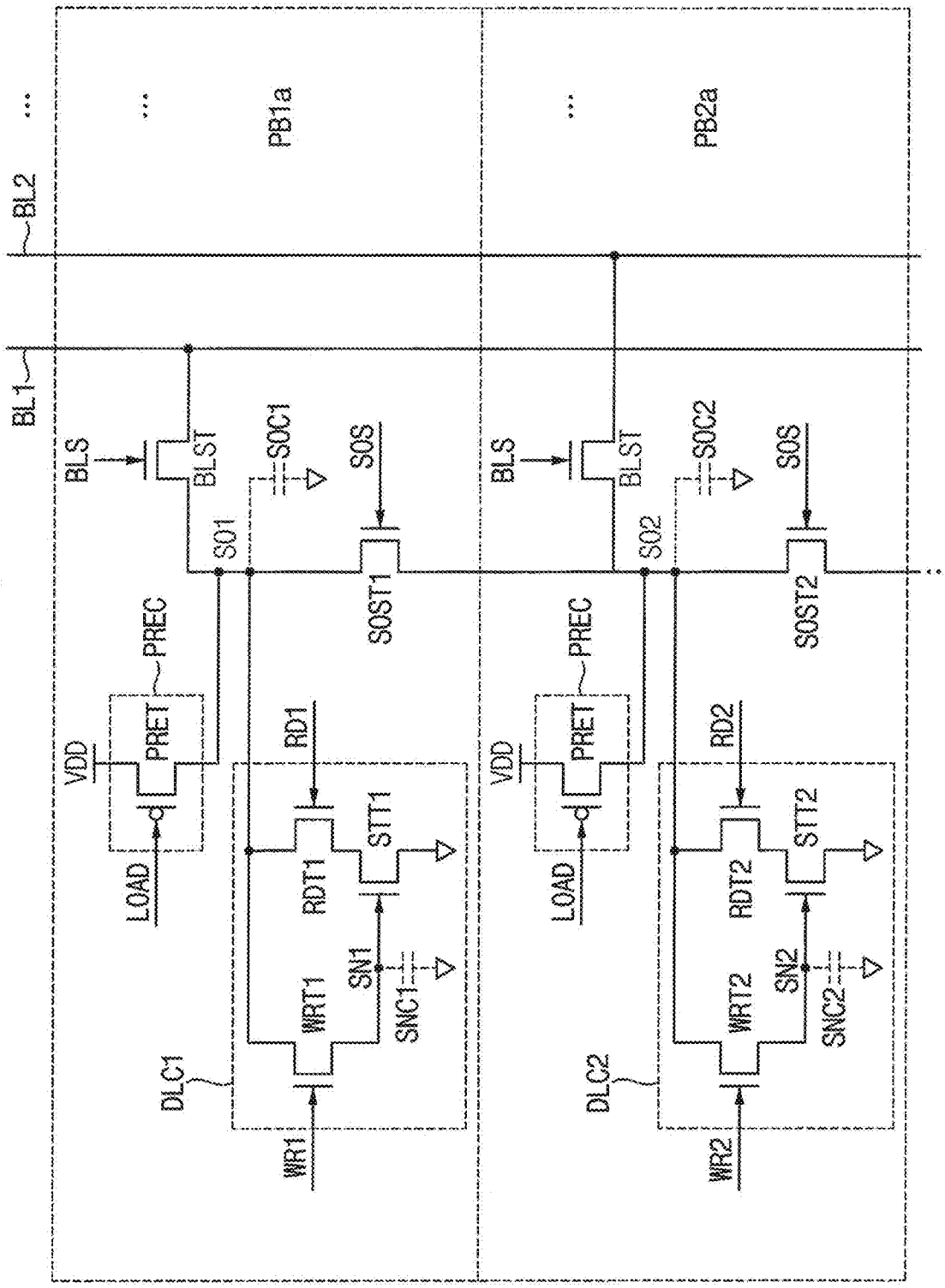
FIG. 8 is a circuit diagram illustrating first and second page buffers included in a page buffer circuit of FIG. 7 according to example embodiments.
Figure 9:
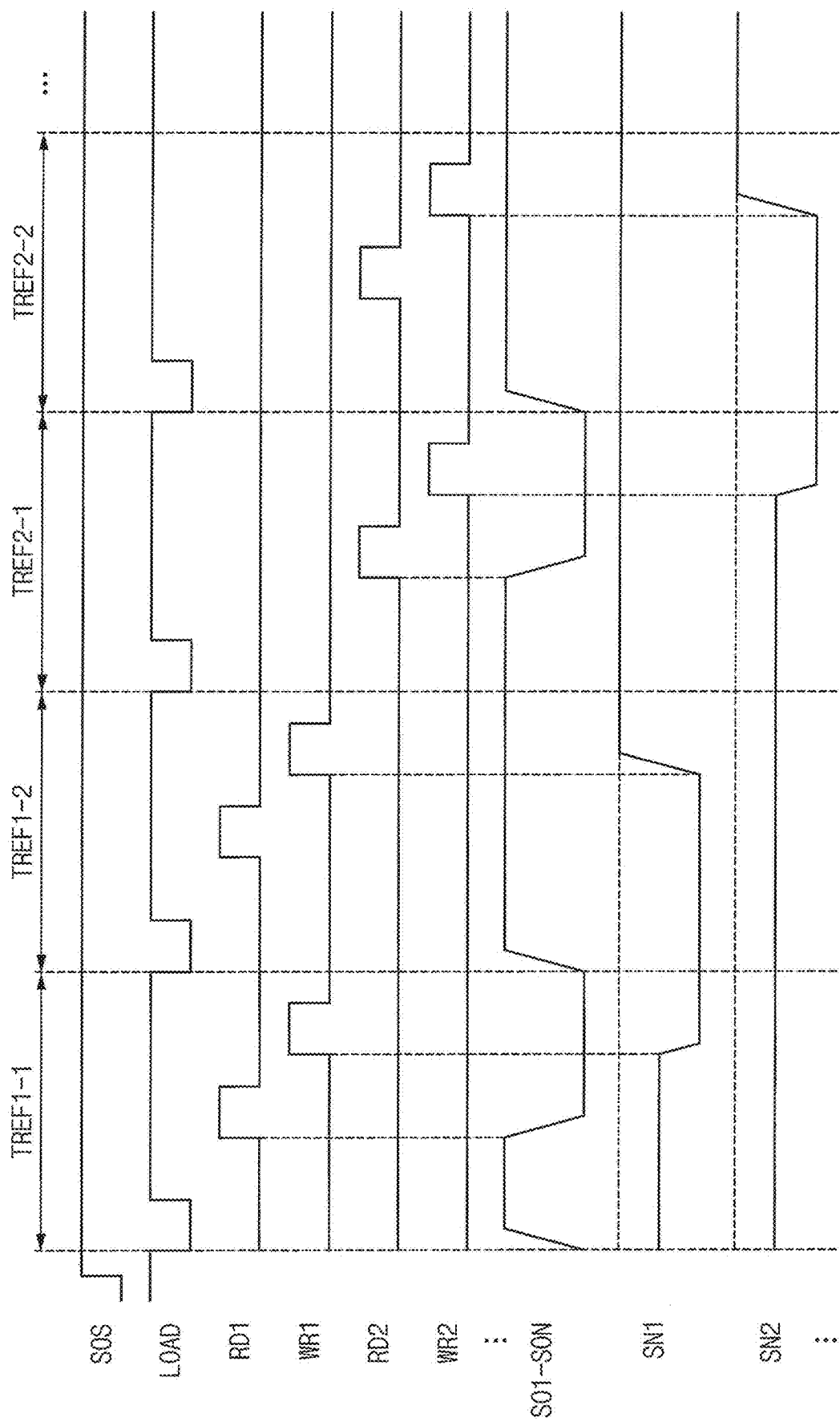
FIG. 9 is a timing diagram for describing an example of refresh operations of first and second page buffers storing data representing first states.
Figure 10:
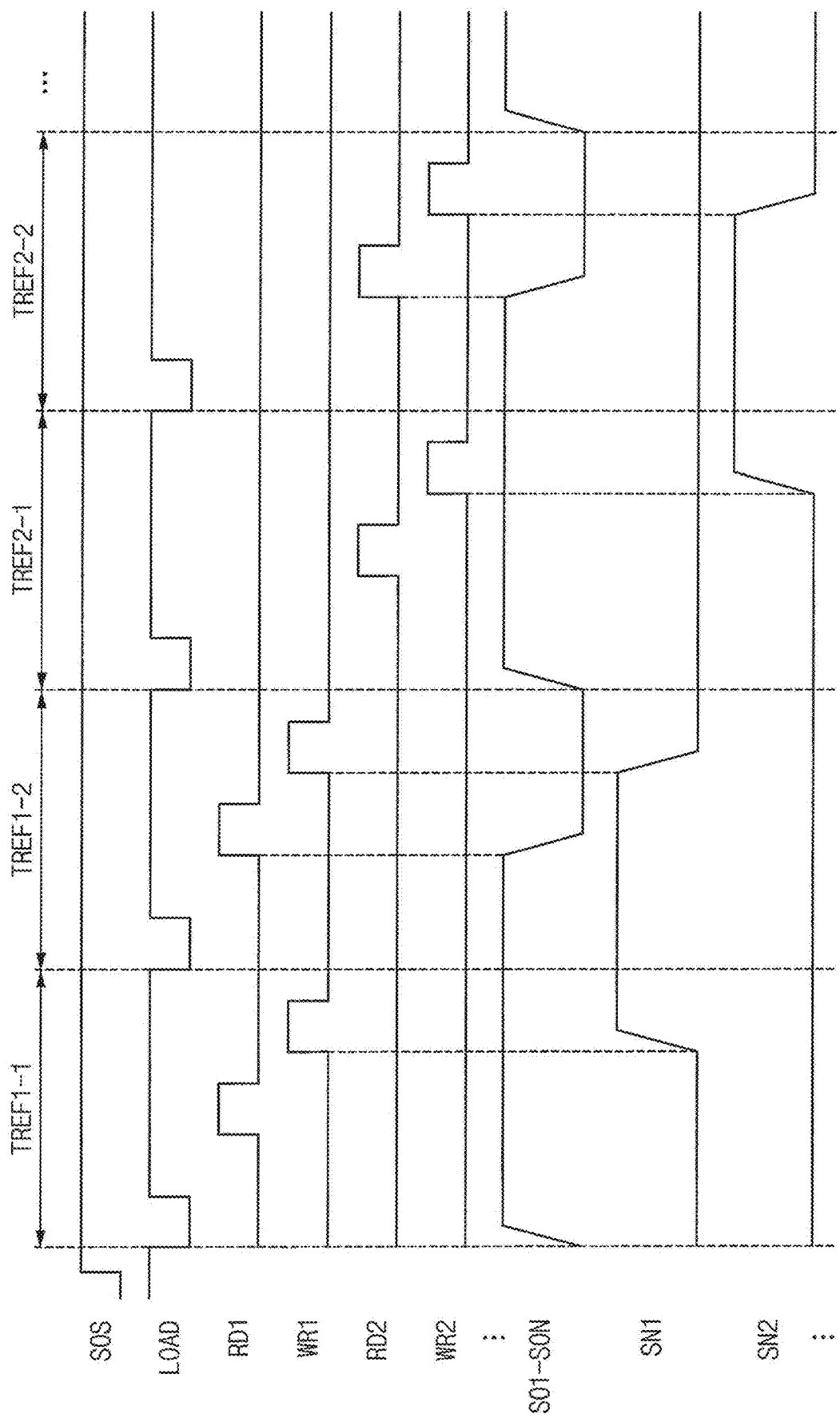
FIG. 10 is a timing diagram for describing an example of refresh operations of first and second page buffers storing data representing second states.

FIG. 7 is a block diagram illustrating a page buffer circuit according to example embodiments, FIG. 8 is a circuit diagram illustrating first and second page buffers included in a page buffer circuit of FIG. 7 according to example embodiments, FIG. 9 is a timing diagram for describing an example of refresh operations of first and second page buffers storing data representing first states, and FIG. 10 is a timing diagram for describing an example of refresh operations of first and second page buffers storing data representing second states.

Referring to FIGS. 7 and 8, a page buffer circuit 100a may include a plurality of page buffers PB1a, PB2a, PB3a, . . . PBNa. The page buffer circuit 100a of FIG. 7 may have substantially the same configuration as a page buffer circuit 100 of FIG. 1, except that N page buffers PB1a through PBNa may further include sensing node sharing transistors SOST1, SOST2 and SOST3 that connect sensing nodes SO1, SO2, . . . , SON of the N page buffers PB1a through PBNa to each other, where N is an integer greater than 1. In some example embodiments, the N page buffers PB1a through PBNa may include N−1 sensing node sharing transistors SOST1, SOST2 and SOST3. Further, each page buffer PB1a, and PB2a, of FIG. 8 may have substantially the same configuration as a page buffer PB of FIG. 2, except that each page buffer PB1a and PB2a may further include the sensing node sharing transistor SOST1 and SOST2.

A sensing node sharing transistor SOST1 of a first page buffer PB1a may connect a sensing node SO1 of the first page buffer PB1a and a sensing node SO2 of a second page buffer PB2a adjacent to the first page buffer PB1a in response to a sensing node sharing signal SOS, and a sensing node sharing transistor SOST2 of the second page buffer PB2a may connect the sensing node SO2 of the second page buffer PB2a and a sensing node SO3 of a third page buffer PB3a adjacent to the second page buffer PB2a in response to the sensing node sharing signal SOS. In this manner, the N−1 sensing node sharing transistors SOST1, SOST2 and SOST3 may connect the sensing nodes SO1 through SON of the N page buffers PB1a through PBNa to each other in response to the sensing node sharing signal SOS. In some example embodiments, the sensing node sharing transistor (e.g., SOST1) of each page buffer (e.g., PB1a) may include a gate receiving the sensing node sharing signal SOS, a first terminal connected to the sensing node (e.g., SO1) of the page buffer (e.g., PB1a), and a second terminal connected to the sensing node (e.g., SO2) of another page buffer (e.g., PB2a) adjacent to the page buffer (e.g., PB1a). Although it is not illustrated in FIG. 7, sensing nodes of (N+1)-th through (2N)-th page buffers disposed in a direction substantially perpendicular to an extending direction of each bitline from first through N-th page buffers PB1a through PBNa also may be connected to each other in response to the sensing node sharing signal SOS. Thus, in the page buffer circuit 100a, the sensing nodes of N stages of page buffers may be connected to each other in response to the sensing node sharing signal SOS.

While data stored in storage nodes SN1 and SN2 of the plurality of page buffers PB1a through PBNa are refreshed, the sensing nodes SO1 through SON of the N page buffers PB1a through PBNa may be connected to each other. Further, the N page buffers PB1a through PBNa may sequentially refresh the data stored in the storage nodes SN1 and SN2 of the N page buffers PB1a through PBNa. Since the sensing nodes SO1 through SON of the N page buffers PB1a through PBNa are connected to each other, each (e.g., PB1a) of the N page buffers PB1a through PBNa may refresh the data stored in the storage node (e.g., SN1) by using charge sharing between the storage node (e.g., SN1) of each (e.g., PB1a) of the N page buffers PB1a through PBNa and the sensing nodes SO1 through SON of the N page buffers PB1a through PBNa. In this case, since the data stored in the storage node (e.g., SN1 or SN2), or the data stored in a storage capacitor (e.g., SNC1 or SNC2) connected to the storage node (e.g., SN1 or SN2) are refreshed by using N sensing capacitors SOC1 and SOC2 of the N sensing nodes SO1 through SON connected to each other, a voltage of the refreshed storage node (e.g., SN1 or SN2) may have a desired voltage level, and a retention time of each page buffer PB1a through PBNa may be improved.

For example, as illustrated in FIG. 9, while data stored in the page buffer circuit 100a is refreshed, the sensing node sharing signal SOS may have a high level, and first through N-th sensing nodes SO1 through SON of the first through N-th page buffers PB1a through PBNa may be connected to each other. Further, although it is not illustrated, sensing nodes of N stages of page buffers other than the first through N-th page buffers PB1a through PBNa, such as the sensing nodes of the (N+1)-th through (2N)-th page buffers, sensing nodes of (2N+1)-th through (3N)-th page buffers, etc., also may be connected to each other. FIG. 9 illustrates an example where the first and second page buffers PB1a and PB2a store data representing first states.

During first and second refresh times TREF1-1 and TREF1-2, first and second refresh operations for the first page buffer PB1a may be performed. In the first refresh time TREF1-1, precharge circuits PREC of the first through N-th page buffers PB1a through PBNa may precharge the first through N-th sensing nodes SO1 through SON of the first through N-th page buffers PB1a through PBNa to a power supply voltage VDD in response to a load signal LOAD, a first read transistor RDT1 and a first storage transistor STT1 of the first page buffer PB1a may provide a ground voltage to the first through N-th sensing nodes SO1 through SON in response to a first read signal RD1 such that inverted data representing a second state are stored in the first through N-th sensing nodes SO1 through SON, and a first write transistor WRT1 of the first page buffer PB1a may connect a first storage node SN1 to the first through N-th sensing nodes SO1 through SON such that the inverted data of the first through N-th sensing nodes SO1 through SON are stored in the first storage node SN1 by charge sharing between the first storage node SN1 and the first through N-th sensing nodes SO1 through SON, or by the charge sharing between a first storage capacitor SNC1 of the first storage node SN1 and first through N-th sensing capacitors SOC1 and SOC2 of the first through N-th sensing nodes SO1 through SON. In the second refresh time TREF1-2, the first through N-th sensing nodes SO1 through SON may be precharged to the power supply voltage VDD in response to the load signal LOAD, the first through N-th sensing nodes SO1 through SON may maintain the power supply voltage VDD corresponding to the data representing the first state by the first storage transistor STT1 that is turned off based on the inverted data of the first storage node SN1, and the first write transistor WRT1 may connect the first storage node SN1 to the first through N-th sensing nodes SO1 through SON such that the data of the first through N-th sensing nodes SO1 through SON are stored in the first storage node SN1 by the charge sharing between the first storage node SN1 and the first through N-th sensing nodes SO1 through SON.

Thereafter, during third and fourth refresh times TREF2-1 and TREF2-2, first and second refresh operations for the second page buffer PB2a may be performed. In the third refresh time TREF2-1, the first through N-th sensing nodes SO1 through SON may be precharged to the power supply voltage VDD, a second read transistor RDT2 and a second storage transistor STT2 of the second page buffer PB2a may provide the ground voltage to the first through N-th sensing nodes SO1 through SON in response to a second read signal RD2 such that the inverted data representing the second state are stored in the first through N-th sensing nodes SO1 through SON, and a second write transistor WRT2 of the second page buffer PB2a may connect a second storage node SN2 to the first through N-th sensing nodes SO1 through SON such that the inverted data of the first through N-th sensing nodes SO1 through SON are stored in the second storage node SN2 by charge sharing between the second storage node SN2 and the first through N-th sensing nodes SO1 through SON. In the fourth refresh time TREF2-2, the first through N-th sensing nodes SO1 through SON may be precharged to the power supply voltage VDD, the first through N-th sensing nodes SO1 through SON may maintain the power supply voltage VDD corresponding to the data representing the first state by the second storage transistor STT2 that is turned off based on the inverted data of the second storage node SN2, and the second write transistor WRT2 may connect the second storage node SN2 to the first through N-th sensing nodes SO1 through SON such that data of the first through N-th sensing nodes SO1 through SON are stored in the second storage node SN2 by the charge sharing between the second storage node SN2 and the first through N-th sensing nodes SO1 through SON.

In subsequent refresh times, data of subsequent page buffers, or the third through N-th page buffers PB3a through PBNa may be sequentially refreshed. Accordingly, voltages of the storage nodes SN1 and SN2 of the plurality of page buffers PB1a through PBNa including the first through N-th page buffers PB1a through PBNa may have the desired voltage level.

FIG. 10 illustrates an example where the first and second page buffers PB1a and PB2a store data representing the second states. As illustrated in FIG. 10, the data of the first through N-th page buffers PB1a through PBNa may be sequentially refreshed.

Figure 11:
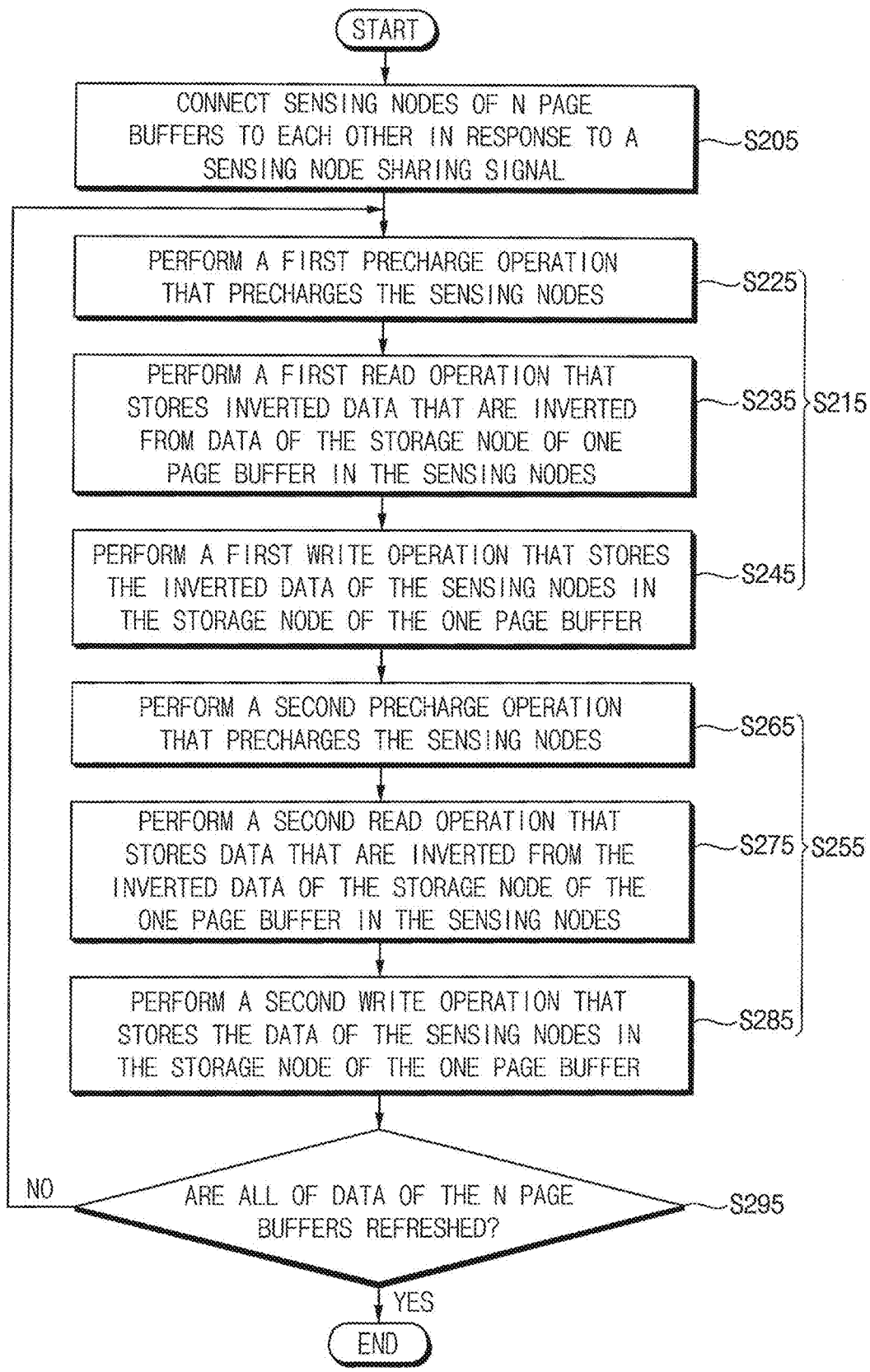
FIG. 11 is a flowchart illustrating a method of refreshing data in a page buffer circuit according to example embodiments.

FIG. 11 is a flowchart illustrating a method of refreshing data in a page buffer circuit according to example embodiments.

Referring to FIGS. 7 and 11, while a page buffer circuit 100a performs a data refresh operation, first through N-th page buffers PB1a through PBNa may connect first through N-th sensing nodes SO1 through SON of the first through N-th page buffers PB1a through PBNa to each other in response to a sensing node sharing signal SOS (S205). The first through N-th page buffers PB1a through PBNa may sequentially perform refresh operations (S215 through S295).

The first page buffer PB1a may perform a first refresh operation (S215) and a second refresh operation (S255) to refresh data stored in a first storage node SN1 of the first page buffer PB1a. To perform the first refresh operation (S215), the first through N-th page buffers PB1a through PBNa may perform a first precharge operation that precharges the first through N-th sensing nodes SO1 through SON (S225), the first page buffer PB1a may perform a first read operation that stores inverted data that are inverted from the data of the first storage node SN1 to the first through N-th sensing nodes SO1 through SON (S235), and the first page buffer PB1a may perform a first write operation that stores the inverted data of the first through N-th sensing nodes SO1 through SON to the first storage node SN1 (S245). Further, to perform the second refresh operation (S255), the first through N-th page buffers PB1a through PBNa may perform a second precharge operation that precharges the first through N-th sensing nodes SO1 through SON (S265), the first page buffer PB1a may perform a second read operation that stores the data that are inverted from the inverted data of the first storage node SN1 to the first through N-th sensing nodes SO1 through SON (S275), and the first page buffer PB1a may perform a second write operation that stores the data of the first through N-th sensing nodes SO1 through SON to the first storage node SN1 (S285).

In a case where all of the data of the first through N-th page buffers PB1a through PBNa are not refreshed (S295: NO), the data of a next page buffer (e.g., PB2a) may be refreshed. Once all of the data of the first through N-th page buffers PB1a through PBNa are refreshed (S295: YES), voltages of storage nodes SN1 and SN2 of the first through N-th page buffers PB1a through PBNa may have a desired voltage level.

FIG. 12 is a diagram illustrating an example of retention times of page buffer circuits of FIGS. 1 and 7.

Referring to FIG. 12, a retention time TRET in a case where each page buffer (e.g., PB1a) performs a refresh operation by using sensing nodes SO1 through SON of N page buffers PB1a through PBNa as illustrated in FIGS. 7 through 11 may be increased compared with a retention time TRET in a case where each page buffer PB performs a refresh operation by using its sensing node SO as illustrated in FIGS. 1 through 5. For example, in a case where each storage capacitor SNC, SNC1 and SNC2 has a capacitance of about 2.8 fF, each sensing capacitor SOC, SOC1 and SOC2 has a capacitance of about 20 fF, and eight sensing nodes SO1 through SON are connected to each other or shared, the retention time TRET in the case where the refresh operation is performed by using the shared sensing nodes SO1 through SON may be about 7.8 ms, and may be longer than the retention time TRET of about 5.1 ms in the case where the refresh operation is performed by using only one sensing node SO.

Figure 13:
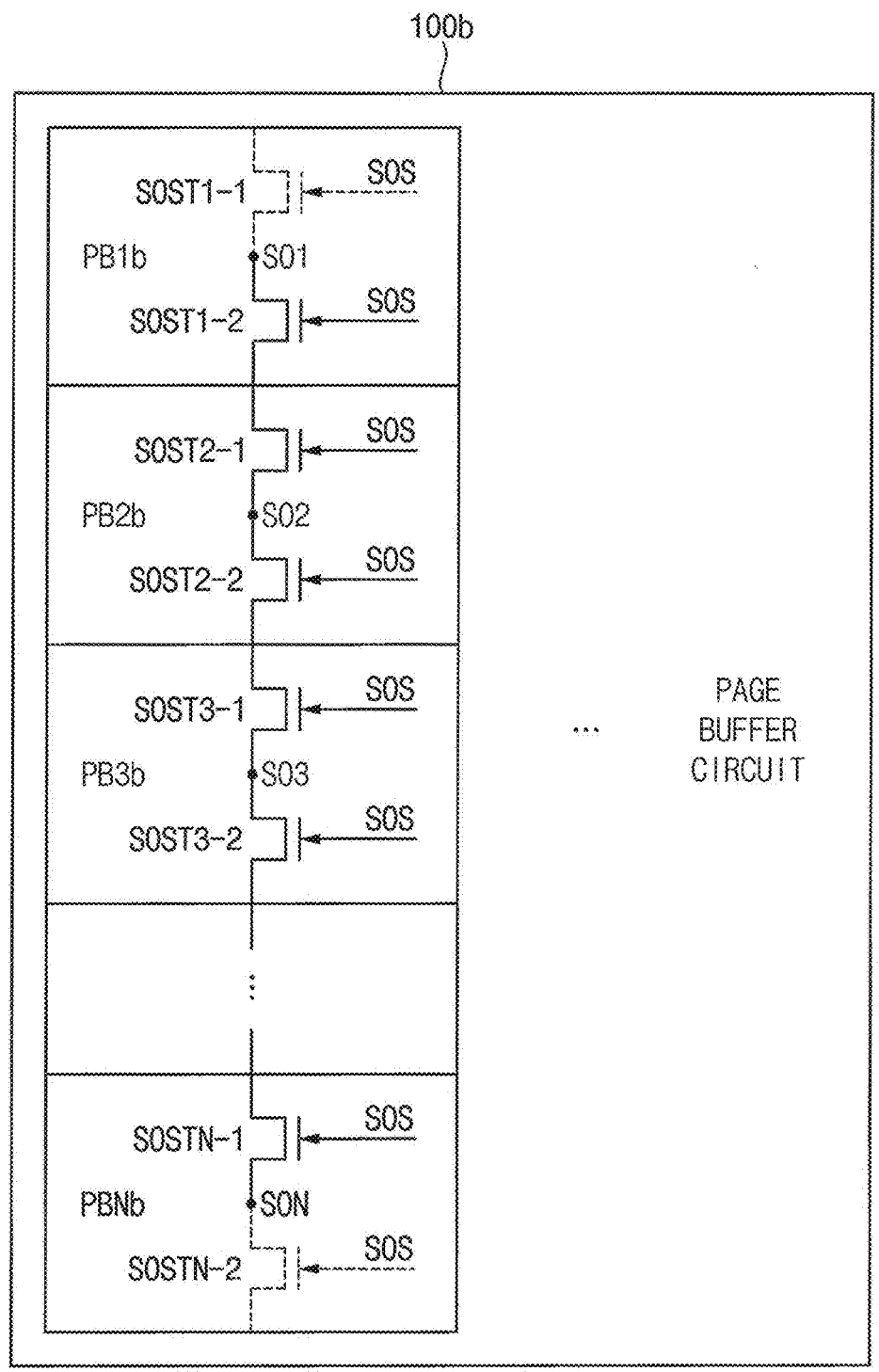
FIG. 13 is a block diagram illustrating a page buffer circuit according to example embodiments.
Figure 14:
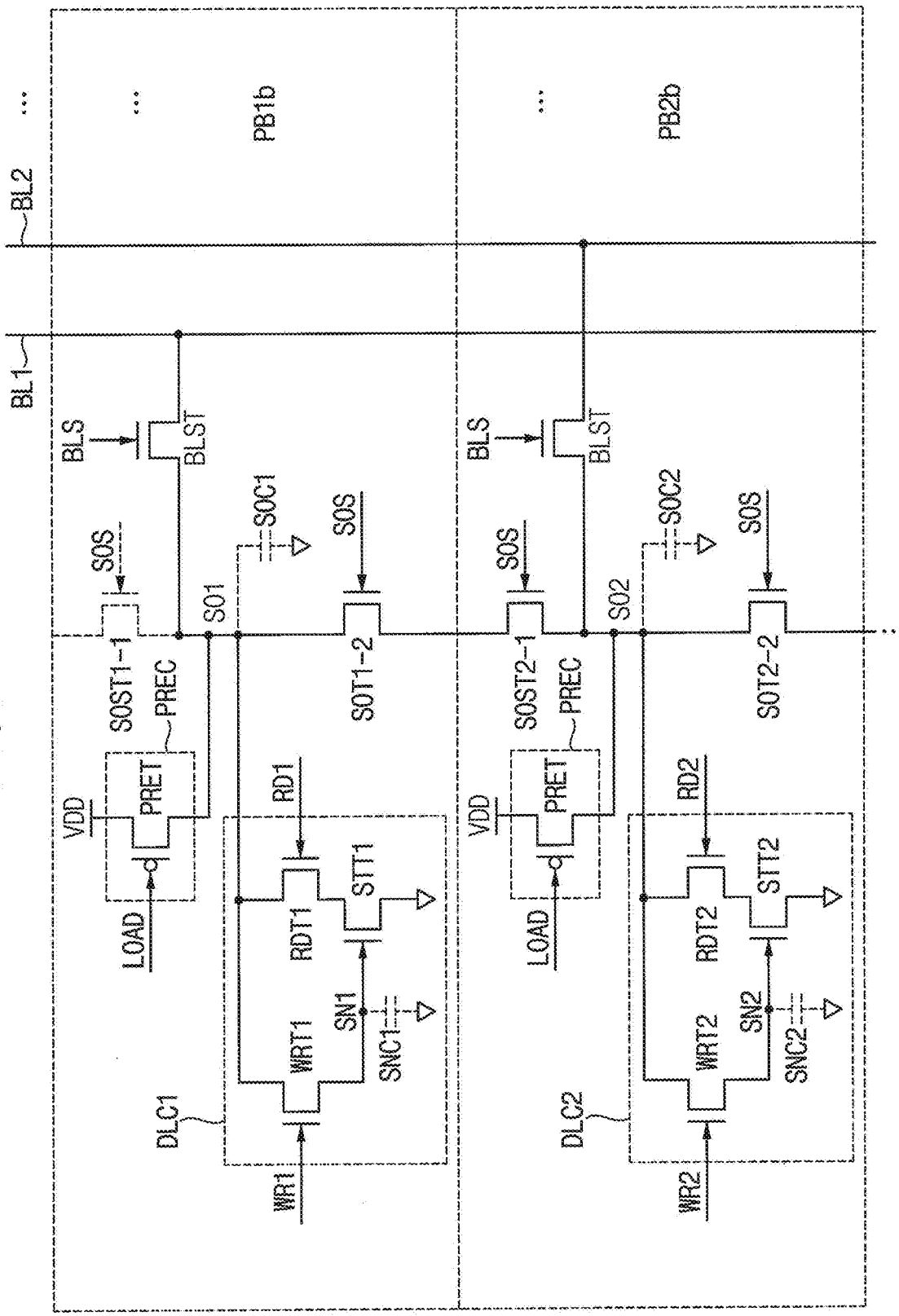
FIG. 14 is a circuit diagram illustrating first and second page buffers included in a page buffer circuit of FIG. 13 according to example embodiments.

FIG. 13 is a block diagram illustrating a page buffer circuit according to example embodiments, and FIG. 14 is a circuit diagram illustrating first and second page buffers included in a page buffer circuit of FIG. 13 according to example embodiments.

Referring to FIGS. 13 and 14, a page buffer circuit 100b may include a plurality of page buffers PB1b, PB2b, PB3b, . . . , PBNb. The page buffer circuit 100b of FIG. 13 may have substantially the same configuration as a page buffer circuit 100 of FIG. 1, except that N page buffers PB1b through PBNb may further include first and second sensing node sharing transistors SOST1-1, SOST1-2, SOST2-1, SOST2-1, SOST3-1, SOST3-2, . . . , SOSTN-1, SOSTN-2 that connect sensing nodes SO1, SO2, . . . , SON of the N page buffers PB1b through PBNb to each other. Further, each page buffer (e.g., PB2b) of FIG. 14 may have substantially the same configuration as a page buffer PB of FIG. 2, except that each page buffer (e.g., PB2b) may further include the first and second sensing node sharing transistors (e.g., SOST2-1 and SOST2-2). In some example embodiments, a first page buffer PB1b of N stages of page buffers PB1b through PBNb may not have the first sensing node sharing transistor SOST1-1, and a last page buffer PBNb of the N stages of page buffers PB1b through PBNb may not have the second sensing node sharing transistor SOSTN-2. In other example embodiments, to improve symmetry, the first page buffer PB1b may include two sensing node sharing transistors SOST1-1 and SOST1-2, and the last page buffer PBNb may include two sensing node sharing transistors SOSTN1 and SOSTN-2.

The first sensing node sharing transistor e.g., SOST2-1) of each page buffer (e.g., PB2b) ay connect a sensing node (e.g., SO2) of the page buffer (e.g., PB2b) and a sensing node (e.g., SO1) of a previous page buffer (e.g., PB1b) in response to a sensing node sharing signal SOS, and the second sensing node sharing transistor (e.g., SOST2-2) of each page buffer (e.g., PB2b) may connect the sensing node (e.g., SO2) of the page buffer (e.g., PB2b) and a sensing node (e.g., SO3) of a next page buffer (e.g., PB3b) in response to the sensing node sharing signal SOS. Since each page buffer (e.g., PB2b) of FIG. 14 includes two sensing node sharing transistors (e.g., SOST2-1 and SOST2-2), each page buffer (e.g., PB2b) of FIG. 14 may have improved symmetry compared with each page buffer (e.g., PB2a) of FIG. 8.

Figure 15:
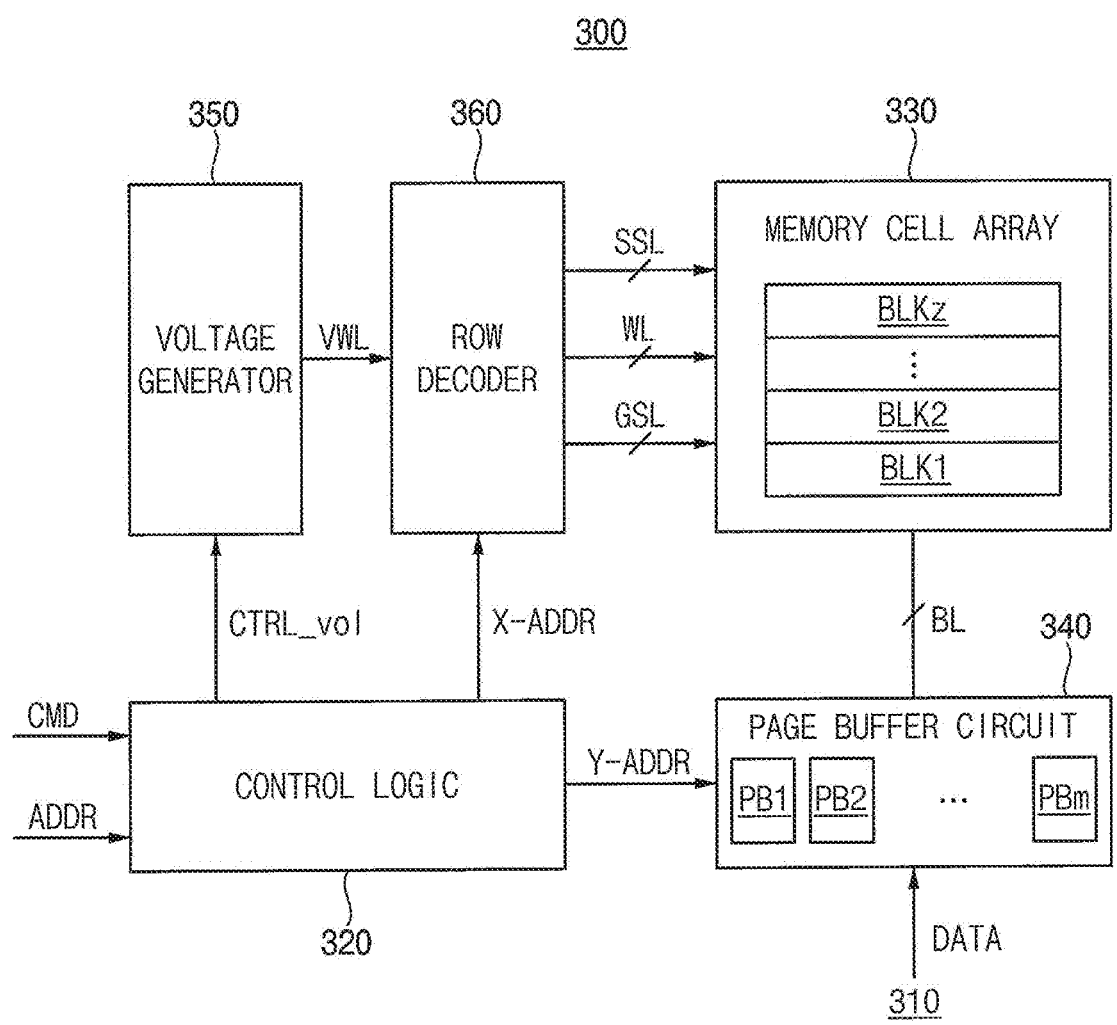
FIG. 15 is a block diagram illustrating a memory device according to example embodiments.

FIG. 15 is a block diagram illustrating a memory device according to example embodiments.

Referring to FIG. 15, a memory device 300 may include a control logic circuitry 320, a memory cell array 330, a page buffer circuit 340, a voltage generator 350, and a row decoder 360. Although not shown in FIG. 15, the memory device 300 may further include a memory interface circuitry 310. In addition, the memory device 300 may further include column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer circuit 340 through bitlines BL and be connected to the row decoder 360 through wordlines WL, string selection lines SSL, and ground selection lines GSL.

In an example embodiment, the memory cell array 330 may include a 3D memory cell array, which includes a plurality of NAND strings. Each of the NAND strings may include memory cells respectively connected to wordlines vertically stacked on a substrate. The disclosures of U.S. Pat. Nos. 7,679,133; 8,553,466; 8,654,587; 8,559,235; and U.S. Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer circuit 340 may be any of page buffer circuits described above with reference to FIGS. 1 through 14. The page buffer circuit 340 may include a plurality of page buffers PB1 to PBm (here, m is an integer greater than or equal to 3), which may be respectively connected to the memory cells through a plurality of bitlines BL. The page buffer circuit 340 may select at least one of the bitlines BL in response to the column address Y-ADDR. The page buffer circuit 340 may operate as a write driver or a sense amplifier according to an operation mode. For example, during a program operation, the page buffer circuit 340 may apply a bitline voltage corresponding to data to be programmed, to the selected bitline. During a read operation, the page buffer circuit 340 may sense current or a voltage of the selected bitline BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a wordline voltage VWL.

The row decoder 360 may select one of a plurality of wordlines WL and select one of a plurality of string selection lines SSL in response to the row address X-ADDR. For example, the row decoder 360 may apply the program voltage and the program verification voltage to the selected wordline WL during a program operation and apply the read voltage to the selected word line WL during a read operation.

Figure 16:
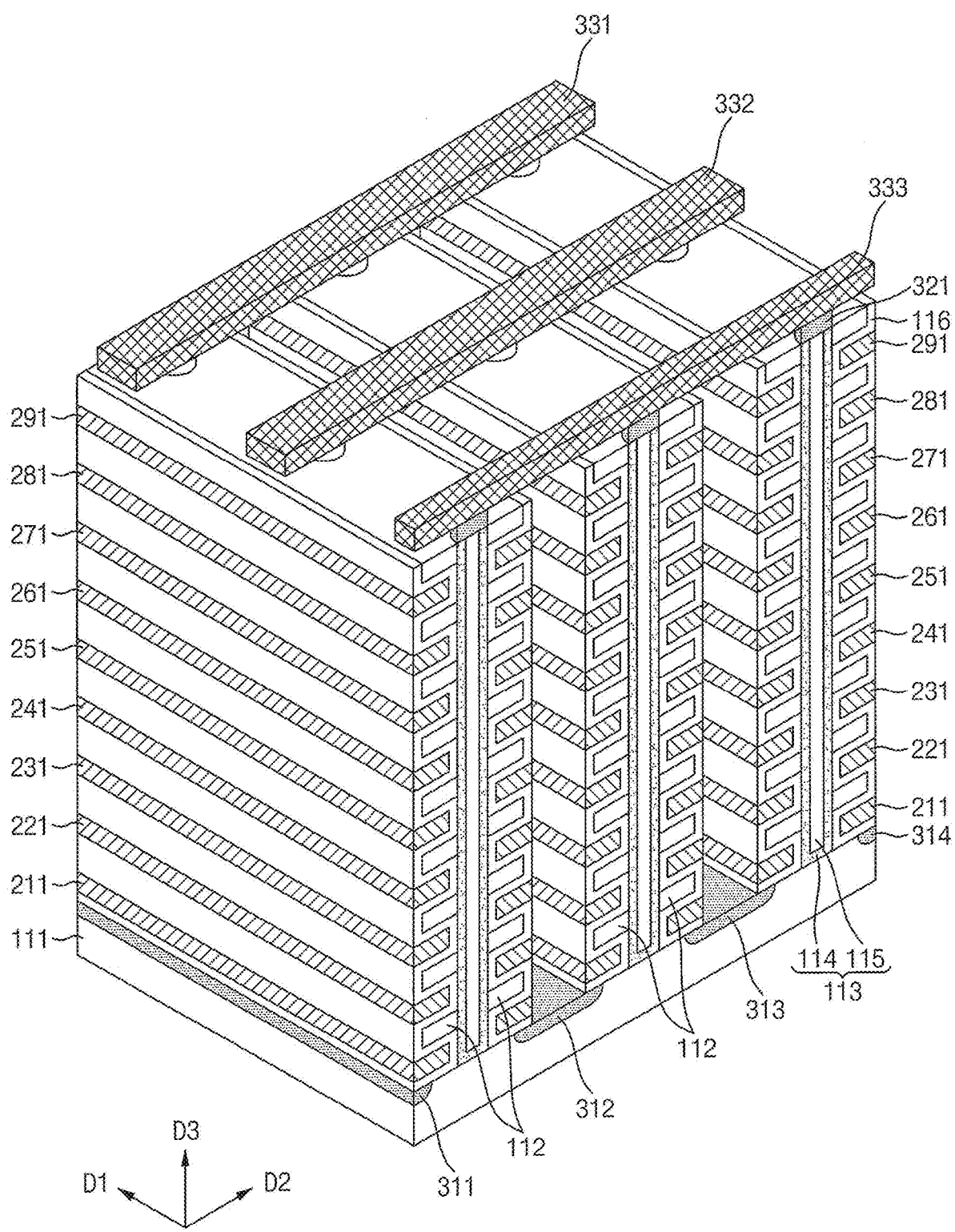
FIG. 16 is a perspective view illustrating an example of a memory block included in a memory cell array of the memory device of FIG. 15.

FIG. 16 is a perspective view illustrating an example of a memory block included in a memory cell array of the memory device of FIG. 15.

Referring to FIG. 16, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductivity type of the substrate 111 is not limited to p-type.

A plurality of doping regions 311, 312, 313 and 314 arranged along the second direction D2 are provided inion the substrate 111. This plurality of doping regions 311 to 314 may have a second type of charge carrier impurity (e.g., a second conductivity type) different from the first type of the substrate 111. In one embodiment of inventive concepts, the first to fourth doping regions 311 to 314 may have n-type. However, the conductivity type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include or may be formed of an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrates the insulation materials 112 to contact the substrate 111.

In some example embodiments, each pillar 113 may include a plurality of materials. For example, a channel layer 114 of each pillar 113 may include or may be formed of a silicon material having a first conductivity type. For example, the channel layer 114 of each pillar 113 may include or may be formed of a silicon material having the same conductivity type as the substrate 111. In one embodiment of inventive concepts, the channel layer 114 of each pillar 113 includes or is formed of p-type silicon. However, the channel layer 114 of each pillar 113 is not limited to the p-type silicon.

An internal material 115 of each pillar 113 includes an insulation material. For example, the internal material 115 of each pillar 113 may include or may be formed of an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). For example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive mated al extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other embodiments of inventive concepts the first conductive materials 211 to 291 may include or may be formed of a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 is provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 321 are provided on the plurality of pillars 113, respectively. The drain regions 321 may include or may be formed of silicon materials doped with a second type of charge carrier impurity. For example, the drain regions 321 may include or may be formed of silicon materials doped with an n-type dopant. In one embodiment of inventive concepts, the drain regions 321 include or are formed of n-type silicon materials. However, the drain regions 321 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 321 in a corresponding region. The drain regions 321 and the second conductive material 333 extending along the second direction D2 may be connected through each contact plug. Each contact plug may be, for example, a conductive plug formed of a conductive material such as a metal. The second conductive materials 331 to 333 may include or may be formed of metal materials. The second conductive materials 331 to 333 may include or may be formed of conductive materials such as a polysilicon.

In the example of FIG. 16, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 17:
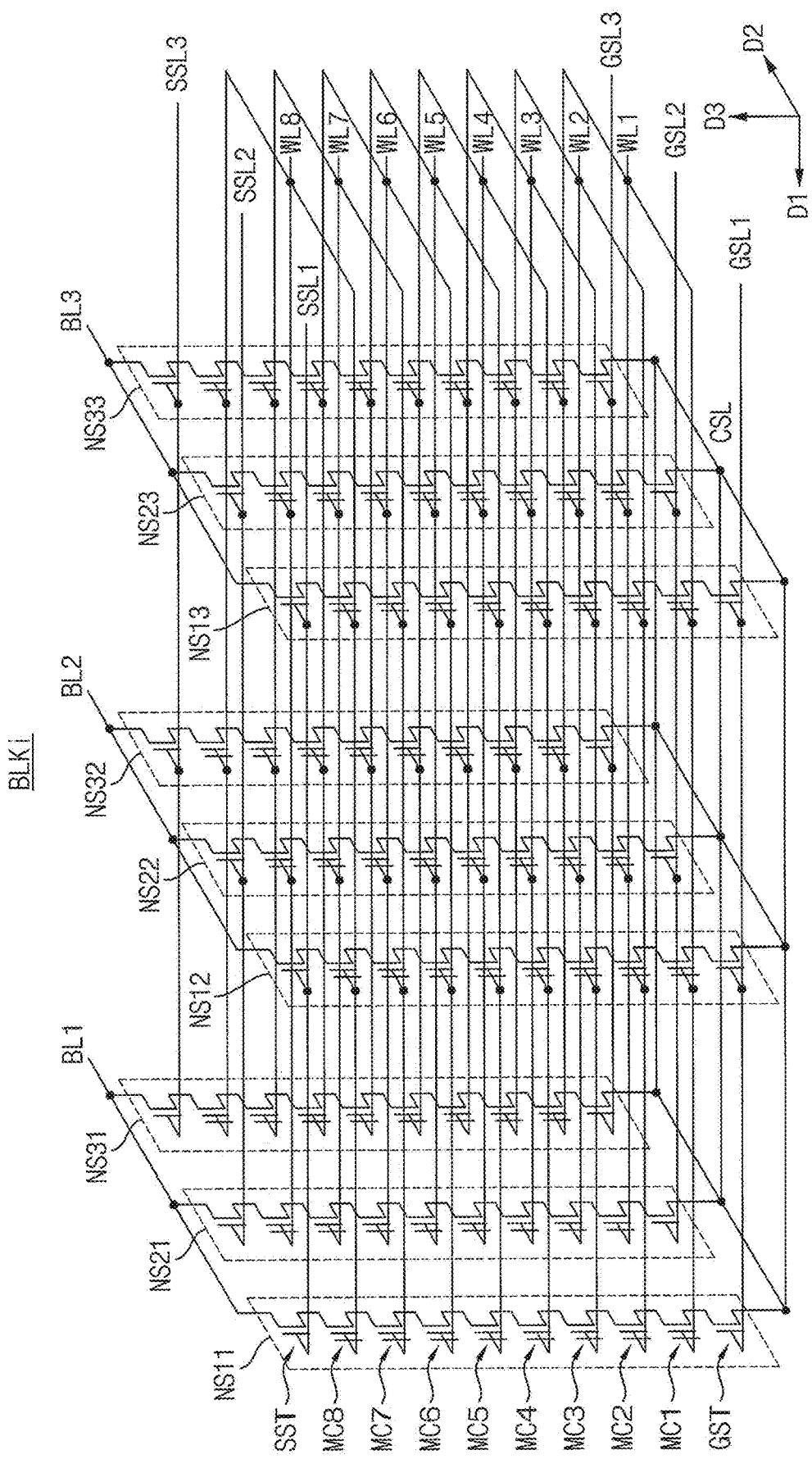
FIG. 17 is a circuit diagram illustrating an equivalent circuit of the memory block described with reference to FIG. 16.

FIG. 17 is a circuit diagram illustrating an equivalent circuit of the memory block described with reference to FIG. 16.

FIG. 17 is a diagram of a 3D V-NAND structure applicable to a Universal Flash Storage (UFS) device according to an embodiment. When a storage module of the UFS device is implemented as a 3D V-NAND flash memory, each of a plurality of memory blocks included in the storage module may be represented by an equivalent circuit shown in FIG. 17.

A memory block BLKi shown in FIG. 17 may refer to a 3D memory block having a 3D structure formed on a substrate. For example, a plurality of memory NAND strings included in the memory block BLKi may be formed in a vertical direction to the substrate.

Referring to FIG. 17, the memory block BLKi may include a plurality of memory NAND strings (e.g., NS11 to NS33), which are connected between bitlines BL1, BL2, and BL3 and a common source line CSL. Each of the memory NAND strings NS11 to NS33 may include a string selection transistor SST, a plurality of memory cells (e.g., MC1, MC2, . . . , and MC8), and a ground selection transistor GST. Each of the memory NAND strings NS11 to NS33 is illustrated as including eight memory cells MC1, MC2, . . . , and MC8 in FIG. 17, without being limited thereto.

The string selection transistor SST may be connected to string selection lines SSL1, SSL2, and SSL3 corresponding thereto. Each of the memory cells MC1 MC2 . . . , and MC8 may be connected to a corresponding one of gate lines GTL1, GTL2, . . . , and GTL8. The gate lines GTL1, GTL2, . . . , and GTL8 may respectively correspond to wordlines, and some of the gate lines GTL1, GTL2, . . . , and GTL8 may correspond to dummy wordlines. The ground selection transistor GST may be connected to ground selection lines GSL1, GSL2, and GSL3 corresponding thereto. The string selection transistor SST may be connected to the bitlines BL1, BL2, and BL3 corresponding thereto, and the ground selection transistor GST may be connected to the common source line CSL.

Wordlines (e.g., WL1) at the same level may be connected in common, and the ground selection lines GSL1, GSL2, and GSL3 and the string selection lines SSL1, SSL2, and SSL3 may be separated from each other. FIG. 17 illustrates a case in which a memory block BLKi is connected to eight gate lines GTL1 GTL2, . . . , and GTL8 and three bitlines BL1, BL2, and BL3, without being limited thereto.

Although the memory cell array included in the memory device according to example embodiments is described based on a NAND flash memory device, the memory device according to example embodiments may be any memory device, e.g., a dynamic random access memory (DRAM), a static random access memory (SRAM), a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 18:
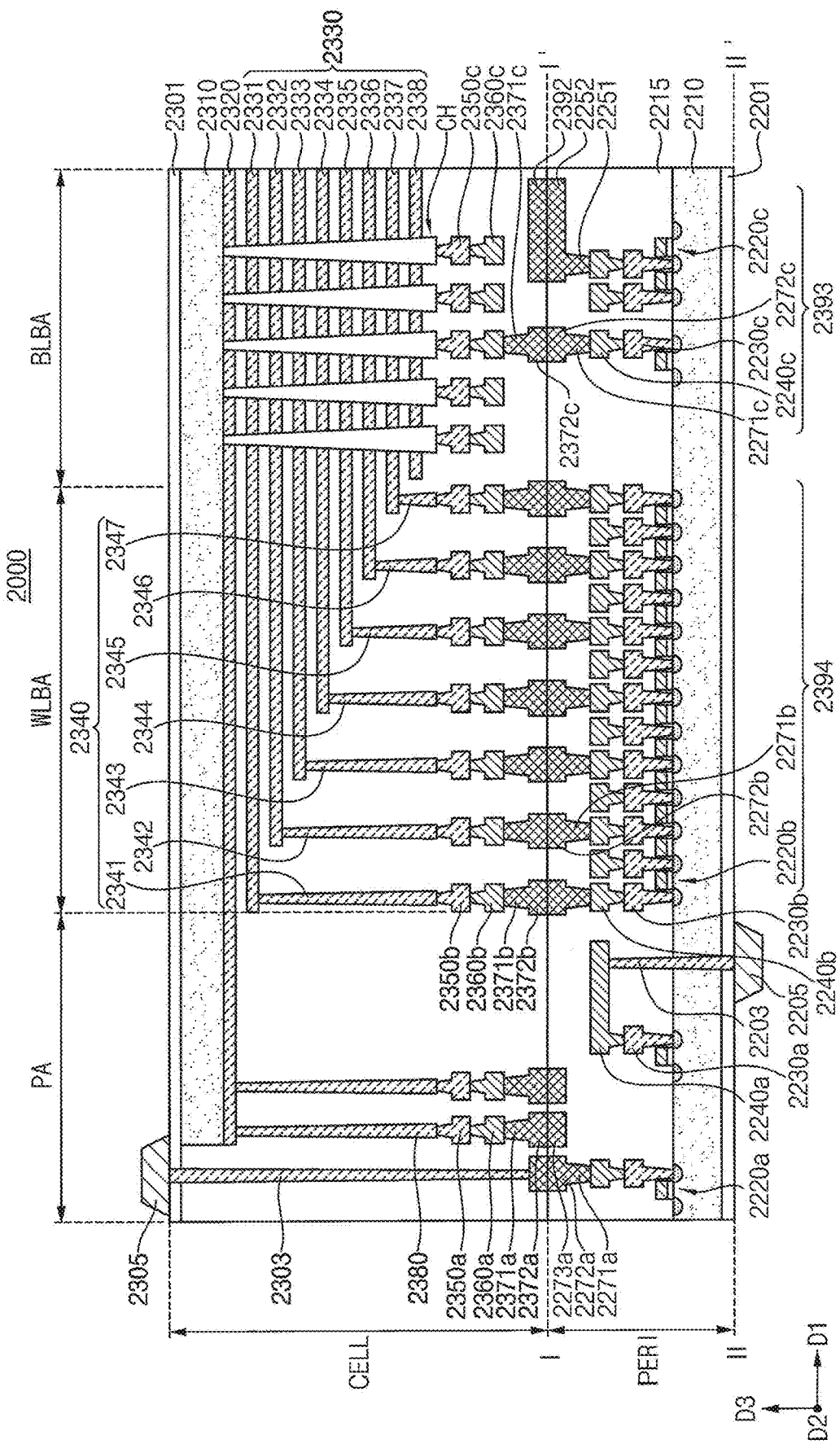
FIG. 18 is a cross-sectional view of a memory device according to example embodiments.

FIG. 18 is a cross-sectional view of a memory device according to example embodiments.

Referring to FIG. 18, a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2740b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 18, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331 to 2338 (e.g., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2 (e.g., a Y-axis direction), parallel to the upper surface of the second substrate 2310.

In an example embodiment illustrated in FIG. 28, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341 to 2347 (e.g., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the e cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 19:
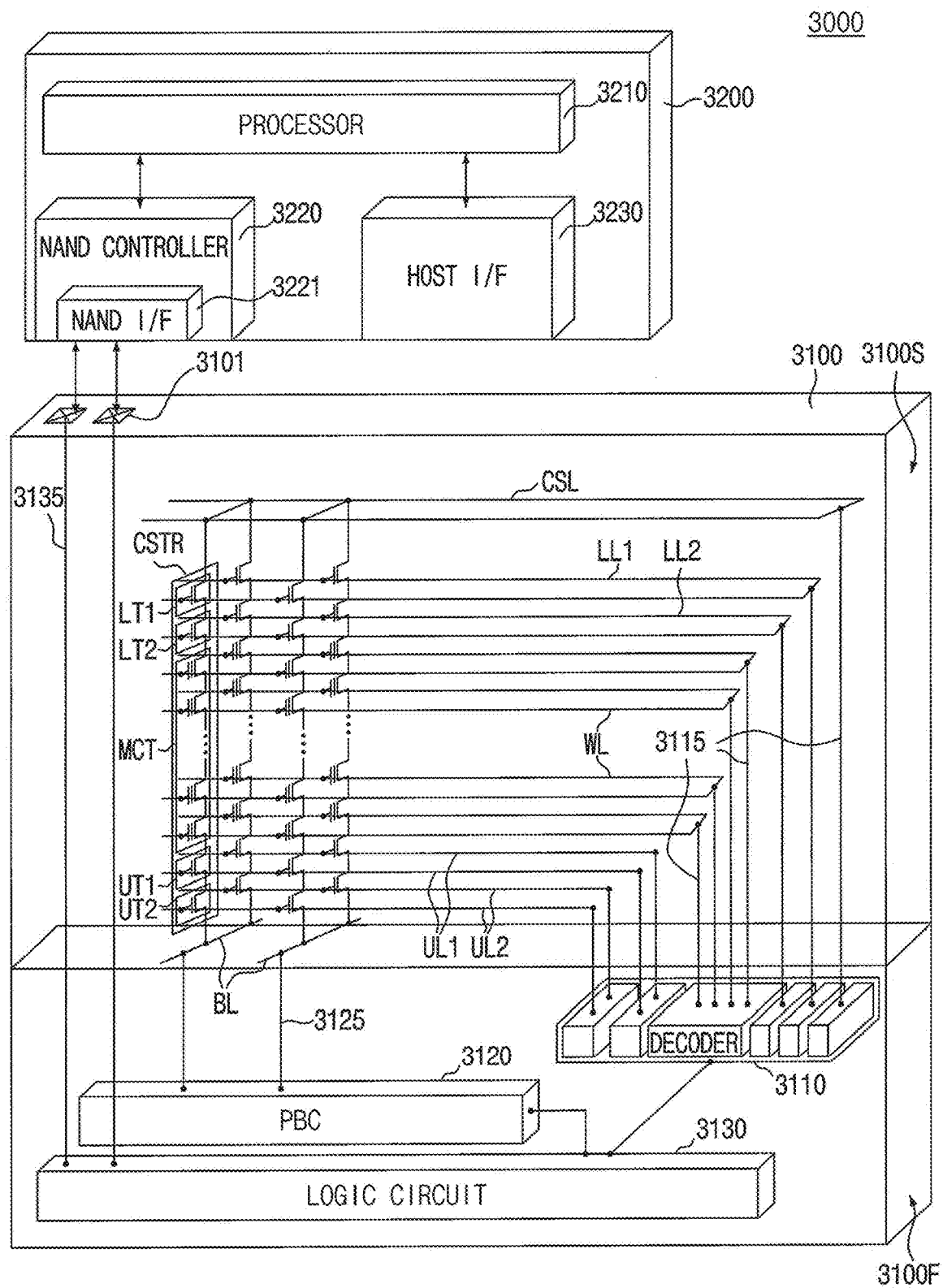
FIG. 19 is a block diagram illustrating an electronic system including a memory device according to example embodiments.

FIG. 19 is a block diagram illustrating an electronic system including a memory device according to example embodiments.

Referring to FIG. 19, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a memory device, for example, a non-volatile memory device that is described above with reference to FIGS. 15 through 18. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

The page buffer circuit 3120 of the semiconductor device 3100 may be any page buffer circuit described above with reference to FIGS. 1 through 14.

Inventive concepts may be applied to various devices and systems that include the memory devices. For example, inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A page buffer circuit comprising:
a plurality of page buffers connected to a plurality of bitlines,
wherein each of the plurality of page buffers comprises a bitline selection transistor configured to connect a corresponding bitline of the plurality of bitlines to a sensing node, a precharge circuit configured to precharge the sensing node, and a dynamic latch circuit configured to store data in a storage node, wherein each of the plurality of page buffers is configured to refresh the data stored in the storage node through charge sharing between the storage node and the sensing node, and wherein each of the plurality of page buffers is configured to perform a first refresh operation and a second refresh operation to refresh the data stored in the storage node, the first refresh operation stores inverted data that are inverted from the data in the storage node, and the second refresh operation stores the data that are inverted from the inverted data in the storage node by using the charge sharing between the storage node and the sensing node.

2. The page buffer circuit of claim 1, wherein each of the plurality of page buffers is configured to perform a first precharge operation that precharges the sensing node in response to a load signal, a first read operation that stores the inverted data that are inverted from the data of the storage node to the sensing node in response to a read signal, and a first write operation that stores the inverted data of the sensing node to the storage node in response to a write signal, the first refresh operation includes the first precharge operation, the first read operation, and the first write operation, each of the plurality of page buffers is configured to perform a second precharge operation that precharges the sensing node in response to the load signal, a second read operation that stores the data that are inverted from the inverted data of the storage node to the sensing node in response to the read signal, and a second write operation that stores the data of the sensing node to the storage node in response to the write signal, and the second refresh operation includes the second precharge operation, the second read operation, and the second write operation.

3. The page buffer circuit of claim 1, wherein the dynamic latch circuit includes:

a read transistor configured to connect the sensing node to a storage transistor in response to a read signal, a write transistor configured to connect the sensing node to the storage node in response to a write signal, and the storage transistor is configured to connect the read transistor to a ground voltage in response to a voltage of the storage node.

4. The page buffer circuit of claim 3, wherein the read transistor includes a gate configured to receive the read signal, a first terminal connected to the sensing node, and a second terminal connected to the storage transistor, the write transistor includes a gate configured to receive the write signal, a first terminal connected to the sensing node, and a second terminal connected to the storage node, and the storage transistor includes a gate connected to the storage node, a first terminal connected to the read transistor, and a second terminal configured to receive the ground voltage.

5. The page buffer circuit of claim 1, wherein the bitline selection transistor includes a gate configured to receive a bitline selection signal, a first terminal connected to the corresponding bitline, and a second terminal connected to the sensing node.

6. The page buffer circuit of claim 1, wherein the precharge circuit includes a precharge transistor including a gate configured to receive a load signal, a first terminal connected to a power supply voltage, and a second terminal connected to the sensing node.

7. The page buffer circuit of claim 1, wherein the plurality of page buffers are configured to substantially and simultaneously refresh the data stored in the storage nodes of the plurality of page buffers.

8. The page buffer circuit of claim 1, wherein at least one page buffer of the plurality of page buffers further comprises:

a sensing node sharing transistor configured to connect the sensing node of the at least one page buffer and the sensing node of an adjacent page buffer of the plurality of page buffers in response to a sensing node sharing signal.

9. The page buffer circuit of claim 8, wherein the sensing node sharing transistor includes a gate configured to receive the sensing node sharing signal, a first terminal connected to the sensing node of the at least one page buffer, and a second terminal connected to the sensing node of the adjacent page buffer.

10. The page buffer circuit of claim 1, wherein the sensing nodes of N page buffers of the plurality of page buffers are configured to connected to each other while the data stored in the storage nodes of the plurality of page buffers are refreshed, and N is an integer greater than 1.

11. The page buffer circuit of claim 10, wherein each of the N page buffers are configured to refresh the data stored in the storage node by using the charge sharing between the storage node of each of the N page buffers and the sensing nodes of the N page buffers.

12. The page buffer circuit of claim 10, wherein the N page buffers are configured to sequentially refresh the data stored in the storage nodes of the N page buffers.

13. The page buffer circuit of claim 1, wherein at least one page buffer of the plurality of page buffers further comprises a first sensing node sharing transistor and a second sending node sharing transistor, the first sensing node sharing transistor is configured to connect the sensing node of the at least one page buffer and the sensing node of a previous page buffer of the plurality of page buffers in response to a sensing node sharing signal, and the second sensing node sharing transistor is configured to connect the sensing node of the at least one page buffer and the sensing node of a next page buffer of the plurality of page buffers in response to the sensing node sharing signal.

14. A page buffer circuit comprising:

a plurality of page buffers connected to a plurality of bitlines, wherein each of the plurality of page buffers comprises a bitline selection transistor configured to connect a corresponding bitline of the plurality of bitlines to a sensing node, a precharge circuit configured to precharge the sensing node in response to a load signal, a dynamic latch circuit configured to store data in a storage node, a first sensing node sharing transistor configured to connect the sensing node of each of the plurality of page buffers and the sensing node of a previous page buffer of the plurality of page buffers in response to a sensing node sharing signal, and a second sensing node sharing transistor configured to connect the sensing node of each of the plurality of page buffers and the sensing node of a next page buffer of the plurality of page buffers in response to the sensing node sharing signal, wherein N page buffers of the plurality of page buffers are configured to connect the sensing nodes of the N page buffers to each other in response to the sensing node sharing signal, where N is an integer greater than 1, wherein the N page buffers are configured to perform a first precharge operation that precharges the sensing nodes of the N page buffers in response to the load signal, wherein one page buffer of the N page buffers is configured to perform a first read operation that stores inverted data that are inverted from the data of the storage node of the one page buffer to the sensing nodes of the N page buffers in response to a read signal, wherein the one page buffer is configured to perform a first write operation that stores the inverted data of the sensing nodes of the N page buffers to the storage node of the one page buffer in response to a write signal, wherein the N page buffers are configured to perform a second precharge operation that precharges the sensing nodes of the N page buffers in response to the load signal, wherein the one page buffer is configured to perform a second read operation that stores the data that are inverted from the inverted data of the storage node of the one page buffer to the sensing nodes of the N page buffers in response to the read signal, and wherein the one page buffer is configured to perform a second write operation that stores the data of the sensing nodes of the N page buffers to the storage node of the one page buffer in response to the write signal.

15. A memory device comprising:
the page buffer circuit of claim 1;
a memory cell array including a plurality of memory cells connected to the plurality of bitlines and a plurality of wordlines; and
the plurality of page buffers of the page buffer circuit are connected to the plurality of bitlines.

16. A page buffer circuit comprising:
a plurality of page buffers connected to a plurality of bitlines,
wherein each of the plurality of page buffers comprises a bitline selection transistor configured to connect a corresponding bitline of the plurality of bitlines to a sensing node, a precharge circuit configured to precharge the sensing node, and a dynamic latch circuit configured to store data in a storage node,
wherein each of the plurality of page buffers is configured to refresh the data stored in the storage node through charge sharing between the storage node and the sensing node,
wherein the dynamic latch circuit includes a read transistor and a write transistor, the read transistor is configured to connect the sensing node to a storage transistor in response to a read signal, the write transistor is configured to connect the sensing node to the storage node in response to a write signal, and the storage transistor is configured to connect the read transistor to a ground voltage in response to a voltage of the storage node,
wherein each of the plurality of page buffers is configured to perform at least one of
a first refresh operation that, in a case where the data stored in the storage node represent a first state, stores inverted data representing a second state in the storage node, and a first refresh process that, in a case where the data stored in the storage node represent the second state, stores inverted data representing the first state in the storage node, wherein, to perform the first refresh operation that stores inverted data representing the second state in the storage node,
the precharge circuit is configured to precharge the sensing node to a power supply voltage in response to a load signal, the read transistor is configured to turn on in response to the read signal to provide a turned-on read transistor,
the storage transistor is configured to be turned on by a first voltage corresponding to the first state of the data of the storage node to provide a turned-on storage transistor,
the turned-on read transistor and the turned-on storage transistor are configured to provide the ground voltage to the sensing node such that the inverted data representing the second state are stored in the sensing node,
the write transistor is configured to turn on in response to the write signal to provide a turned-on write transistor, and
the turned-on write transistor connects the sensing node to the storage node such that the inverted data representing the second state are stored in the storage node by the charge sharing between the storage node and the sensing node, and wherein, to perform the first refresh process that stores inverted data representing the first state in the storage node,
the precharge circuit is configured to precharge the sensing node to the power supply voltage in response to the load signal,
the read transistor is configured to turn on in response to the read signal to provide the turned-on read transistor,
the storage transistor is configured to be turned off by a second voltage corresponding to the second state of the data of the storage node to provide a turned-off storage transistor,
the ground voltage is not provided to the sensing node by the turned-off storage transistor such that the sensing node maintains the power supply voltage corresponding to the inverted data having the first state, and
the write transistor is configured to turn on in response to the write signal to provide the turned-on write transistor and the turned-on write transistor connects the sensing node to the storage node such that the inverted data representing the first state are stored in the storage node by the charge sharing between the storage node and the sensing node.

17. The page buffer circuit of claim 16, wherein
each of the plurality of page buffers is configured to perform the first refresh operation that, in the case where the data stored in the storage node represent the first state, stores inverted data representing the second state in the storage node.

18. The page buffer circuit of claim 17, wherein
each of the plurality of page buffers is configured perform a second refresh operation that, in the case where the inverted data in the storage node represent the second state, stores the data representing the first state in the storage node, and to perform the second refresh operation that stores the data representing the first state in the storage node, the precharge circuit is configured to precharge the sensing node to the power supply voltage in response to the load signal, the read transistor is configured to turn on in response to the read signal, the storage transistor is configured to be turned off by the second voltage corresponding to the second state of the inverted data of the storage node to provide the turned-off storage transistor, the ground voltage is not provided to the sensing node by the turned-off storage transistor such that the sensing node is configured to maintain the power supply voltage corresponding to the data having the first state, the write transistor is configured to turn on in response to the write signal to provide the turned-on write transistor, and the turned-on write transistor connects the sensing node to the storage node such that the data representing the first state are stored in the storage node by the charge sharing between the storage node and the sensing node.

19. The page buffer circuit of claim 16, wherein each of the plurality of page buffers is configured to perform the first refresh process that, in a case where the data stored in the storage node represent the second state, stores inverted data representing the first state in the storage node.

20. The page buffer circuit of claim 19, wherein each of the plurality of page buffers is configured to perform a second refresh operation process that, in the case where the inverted data in the storage node represent the first state, stores the data representing the second state in the storage node, and to perform the second refresh process that stores the data representing the second state in the storage node, the precharge circuit is configured to precharge the sensing node to the power supply voltage in response to the load signal, the read transistor is configured to turn on in response to the read signal to provide the turned-on read transistor, the storage transistor is configured to be turned on by the first voltage corresponding to the first state of the inverted data of the storage node to provide the turned-on storage transistor, the turned-on read transistor and the turned-on storage transistor provide the ground voltage to the sensing node such that the data representing the second state are stored in the sensing node, the write transistor is configured to turn on in response to the write signal to provide the turned-on write transistor and the turned-on write transistor connects the sensing node to the storage node such that the data representing the second state are stored in the storage node by the charge sharing between the storage node and the sensing node, and wherein the bitline selection transistor includes a gate configured to receive a bitline selection signal, a first terminal connected to the corresponding bitline, and a second terminal connected to the sensing node.

* * * * *